(12) United States Patent
Miyata et al.

(10) Patent No.: US 8,212,471 B2
(45) Date of Patent: Jul. 3, 2012

(54) LIGHT EMITTING DEVICE AND ELECTRONIC EQUIPMENT PROVIDED WITH THE LIGHT EMITTING DEVICE

(75) Inventors: Masayasu Miyata, Kawasaki (JP); Yuji Shinohara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 353 days.

(21) Appl. No.: 11/988,652

(22) PCT Filed: Jul. 11, 2006

(86) PCT No.: PCT/JP2006/314127
§ 371 (c)(1),
(2), (4) Date: Jan. 11, 2008

(87) PCT Pub. No.: WO2007/010880
PCT Pub. Date: Jan. 25, 2007

(65) Prior Publication Data
US 2009/0102359 A1    Apr. 23, 2009

(30) Foreign Application Priority Data
Jul. 15, 2005    (JP) .................................. 2005-206550

(51) Int. Cl.
*H01J 1/62* (2006.01)
*H01J 63/04* (2006.01)
(52) U.S. Cl. ......................... 313/504; 313/498; 313/506
(58) Field of Classification Search ........... 313/498–512
See application file for complete search history.

(56) References Cited

U.S. PATENT DOCUMENTS

| | | | |
|---|---|---|---|
| 6,910,933 B1 * | 6/2005 | Matsuo et al. | 445/24 |
| 7,868,331 B2 | 1/2011 | Ono et al. | |
| 2003/0032361 A1 * | 2/2003 | Murasko et al. | 445/24 |
| 2003/0116772 A1 * | 6/2003 | Yamazaki et al. | 257/83 |
| 2006/0192210 A1 * | 8/2006 | Miyazawa | 257/79 |

FOREIGN PATENT DOCUMENTS

| | | |
|---|---|---|
| JP | A 9-255774 | 9/1997 |
| JP | A 2002-313567 | 10/2002 |
| JP | A 2004-171941 | 6/2004 |
| JP | A 2004-172102 | 6/2004 |
| JP | A 2004-220811 | 8/2004 |
| JP | A 2004-253175 | 9/2004 |
| JP | A 2004-303592 | 10/2004 |
| WO | WO 2004/112440 A1 | 12/2004 |

* cited by examiner

*Primary Examiner* — Joseph L Williams
*Assistant Examiner* — Zachary Snyder
(74) *Attorney, Agent, or Firm* — Oliff & Berridge, PLC

(57) ABSTRACT

A light emitting device having excellent characteristics such as light emitting efficiency and the like and electrical equipment provided with such a light emitting device and having high reliability are provided. The light emitting device includes a light emitting layer 42 formed of a first organic semiconductor material, a hole transport layer (carrier transport layer) 41 formed of a second organic semiconductor material and provided in contact with the light emitting layer 42, and particles 411 provided in contact with both the light emitting layer 42 and the hole transport layer 41, wherein an entire of or a part of each of the particles 411 is embedded in the light emitting layer (the other layer) 42 so that the particles 411 can contain the second organic semiconductor material (organic semiconductor material which constitutes the other layer).

19 Claims, 7 Drawing Sheets

LIGHT EMITTING DEVICE AND ELECTRONIC EQUIPMENT PROVIDED WITH THE LIGHT EMITTING DEVICE

CROSS-REFERENCE TO RELATED APPLICATION

This application claims a priority to Japanese Patent Application No. 2005-206550 filed on Jul. 15, 2005 which is hereby expressly incorporated by reference herein in its entirety.

TECHNICAL FIELD

The present invention relates to a light emitting device and electronic equipment provided with the light emitting device.

BACKGROUND ART

Organic electroluminescent devices (hereinafter, simply referred to as an "organic EL device" or "organic EL element") have been extensively developed in expectation of their use as solid-state luminescent devices or light emitting devices for use in inexpensive large full-color displays.

In general, such an organic EL device has a structure in which a light emitting layer is provided between a cathode and an anode. When an electric field is applied between the cathode and the anode, electrons are injected into the light emitting layer from the cathode side, and holes are injected into the light emitting layer from the anode side.

The injected electrons and holes are recombined in the light emitting layer, which then causes their energy level to return from the conduction band to the valence band. At this time, excitation energy is released as light energy so that the light emitting layer emits light.

In such organic EL devices, it has been known that a layered device structure, in which organic layers formed of organic materials having different carrier transport properties for electrons or holes are provided between a light emitting layer and a cathode and/or an anode, is effective in obtaining a high-efficiency organic EL device with high luminance (see JP-A No. H09-255774).

Therefore, in the field of an organic EL device having a structure in which a light emitting layer and a carrier transport layer are laminated between an anode and a cathode, various researches are carried out on the issues such as molecular structures of a light emitting material and a carrier transport material as well as an appropriate number of the lamination of a light emitting layer and a carrier transport layer and positions and shapes of these layers for the purpose of obtaining improved characteristics such as light emitting efficiency and the like.

DISCLOSURE OF THE INVENTION

It is therefore an object of the present invention to provide a light emitting device having excellent characteristics such as light emitting efficiency and the like, and electrical equipment provided with such a light emitting device and having high reliability.

In order to achieve the above objects, the present invention is directed to a light emitting device. The light emitting device comprises a light emitting layer formed of a first organic semiconductor material; a carrier transport layer formed of a second organic semiconductor material and provided in contact with the light emitting layer; and particles provided in contact with both the light emitting layer and the carrier transport layer, wherein an entire of or a part of each of the particle is embedded in one of the light emitting layer and the carrier transport layer so that the particles can contain the organic semiconductor material which constitutes the other layer.

According to the present invention described above, it is possible to provide a light emitting device having excellent characteristics such as light emitting efficiency and the like.

In the light emitting device according to the present invention, it is preferred that the particles are provided so that each of the particles is embedded in both the light emitting layer and the carrier transport layer.

This makes it possible to improve adhesion between the light emitting layer and the carrier transport layer further.

Further, in the light emitting device according to the present invention, it is preferred that an average particle size of the particles is in the range of 10 to 200 nm.

This makes it possible to increase the contacting area between the first semiconductor material and the second semiconductor material reliably, while preventing the particles from protruding out of the one layer.

Furthermore, in the light emitting device according to the present invention, it is preferred that the number of the particles contained per an area of 1 $mm^2$ of the surface of the other layer on which the particles are provided when viewed from a top thereof is in the range of $1 \times 10^6$ to $1 \times 10^{11}$.

This makes it possible to increase the contacting area between the first semiconductor material and the second semiconductor material reliably, while preventing the particles from unevenly localized at a region of a part of the surface.

Moreover, in the light emitting device according to the present invention, it is preferred that when an area of the surface of the other layer on which the particles are provided when viewed from a top thereof is defined as A [$mm^2$] and the total area of the particles when viewed from a top thereof is defined as B [$mm^2$], the value of B/A satisfies the relation of 0.2 to 0.8.

This makes it possible to increase luminous efficiency of the light emitting layer reliably.

Moreover, in the light emitting device according to the present invention, it is preferred that at least the surface of each particle and its vicinity are mainly formed of the organic semiconductor material which constitutes the other layer.

This makes it possible for the particles to exhibit the same characteristics as those of the other layer.

Moreover, in the light emitting device according to the present invention, it is also preferred that each of the particles is formed from a particulate porous carrier, wherein the organic semiconductor material which constitutes the other layer being carried by the porous carrier.

According to this structure, since the organic semiconductor material which constitutes the other layer is carried by the porous carriers so that the organic semiconductor material enters pores of each carrier, the adhesion between the porous carriers and the organic semiconductor material is enhanced.

Moreover, in the light emitting device according to the present invention, it is also preferred that the porosity of each of the porous carriers is in the range of 20 to 75%.

This makes it possible to fill the pores of the porous carriers with a larger amount of organic semiconductor material which constitutes the other layer, while preventing the mechanical strength of the porous carriers from being lowered.

Moreover, in the light emitting device according to the present invention, it is also preferred that the particles are obtained by, after the porous carriers have been provided on the other layer, supplying a liquid material containing the constituent material of the other layer or its precursor onto the porous carriers so that the porous carriers are impregnated with the liquid material.

This makes it possible to improve adhesion between the particles and the other layer.

Moreover, in the light emitting device according to the present invention, it is also preferred that the porous carriers are mainly formed of inorganic oxide.

This makes it possible to obtain carries which do not give any affect on the characteristics of the organic semiconductor material which constitutes the other layer and which is carried by the carriers relatively easily.

In the light emitting device described above, it is preferred that the inorganic oxide includes at least one or more of $SiO_2$, $Al_2O_3$, ZnO, $SnO_2$, $CeO_2$, ITO, $TiO_2$, CuO, $Fe_2O_3$, CoO, and $Y_2O_3$.

This also makes it possible to obtain carries which do not give any affect on the characteristics of the organic semiconductor material which constitutes the other layer and which is carried by the carriers relatively easily.

Moreover, in the light emitting device described above, it is preferred that the other layer is a hole transport layer having the function of transporting holes.

Such a light emitting device can have excellent characteristics such as luminous efficiency and the like.

Another aspect of the present invention is directed to electrical equipment provided with the light emitting device described above.

Such electronic equipment can have excellent reliability.

BEST MODE FOR CARRYING OUT THE INVENTION

Hereinbelow, a light emitting device and electronic equipment provided with the light emitting device according to the present invention will be described in detail with reference to preferred embodiments shown in the accompanying drawings.

It is to be noted that the following description will be made with regard to one representative case where the light emitting device of the present invention is embodied as an organic electroluminescent device (hereinafter, simply referred to as "organic EL device" or "organic EL element").

<<Organic EL Device>>

(First Embodiment)

Figure 1:
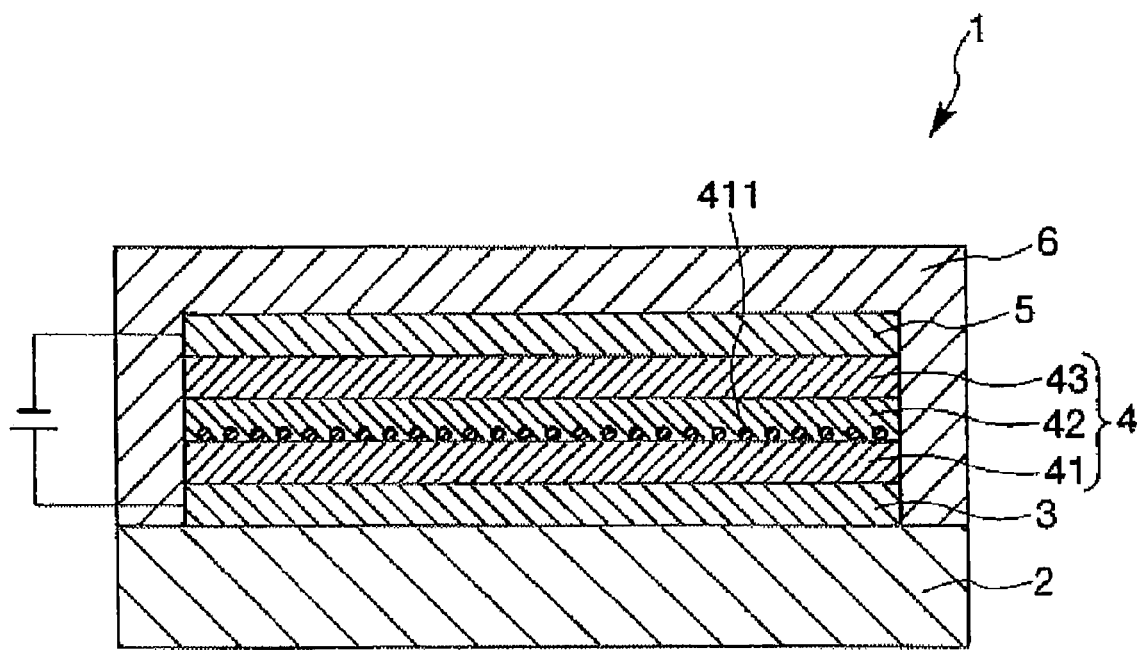
FIG. 1 is a cross-sectional view of an organic EL device which is one example of a light emitting device according to the present invention.
Figure 2:
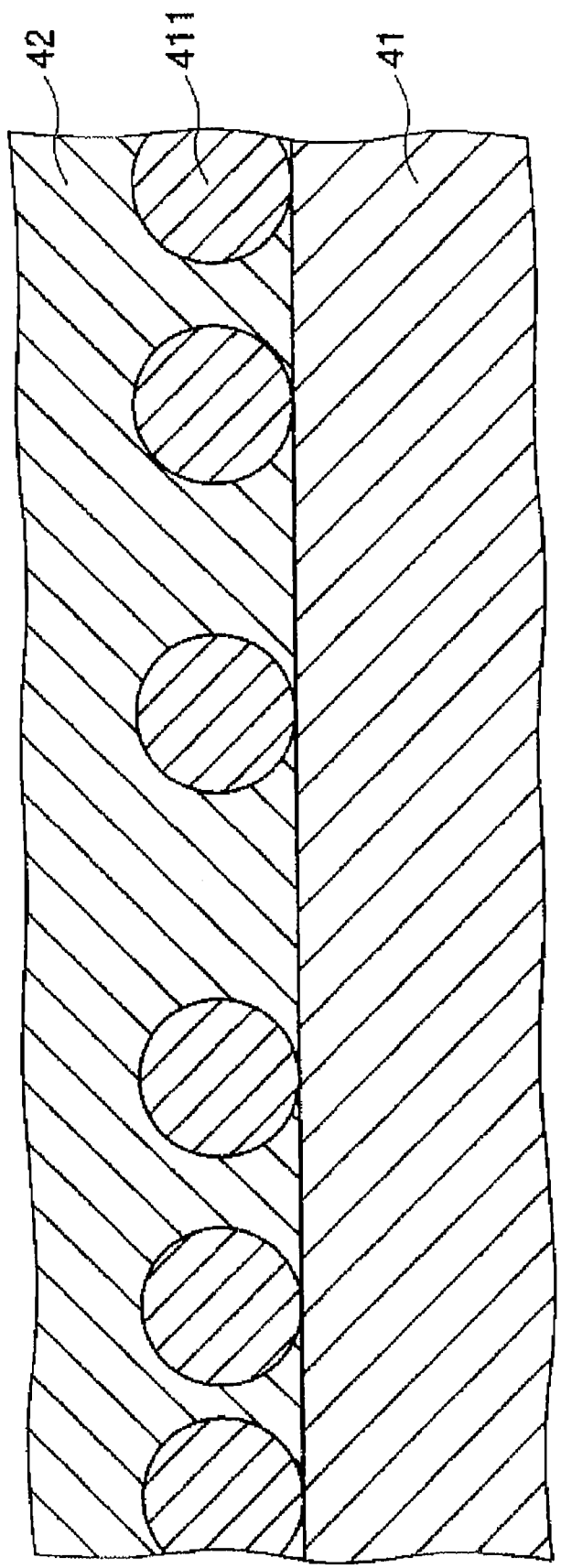
FIG. 2 is an enlarged cross-sectional view of a part which is in the vicinity of a boundary between a hole transport layer and a light emitting layer of the organic EL device shown in FIG. 1.
Figure 3:
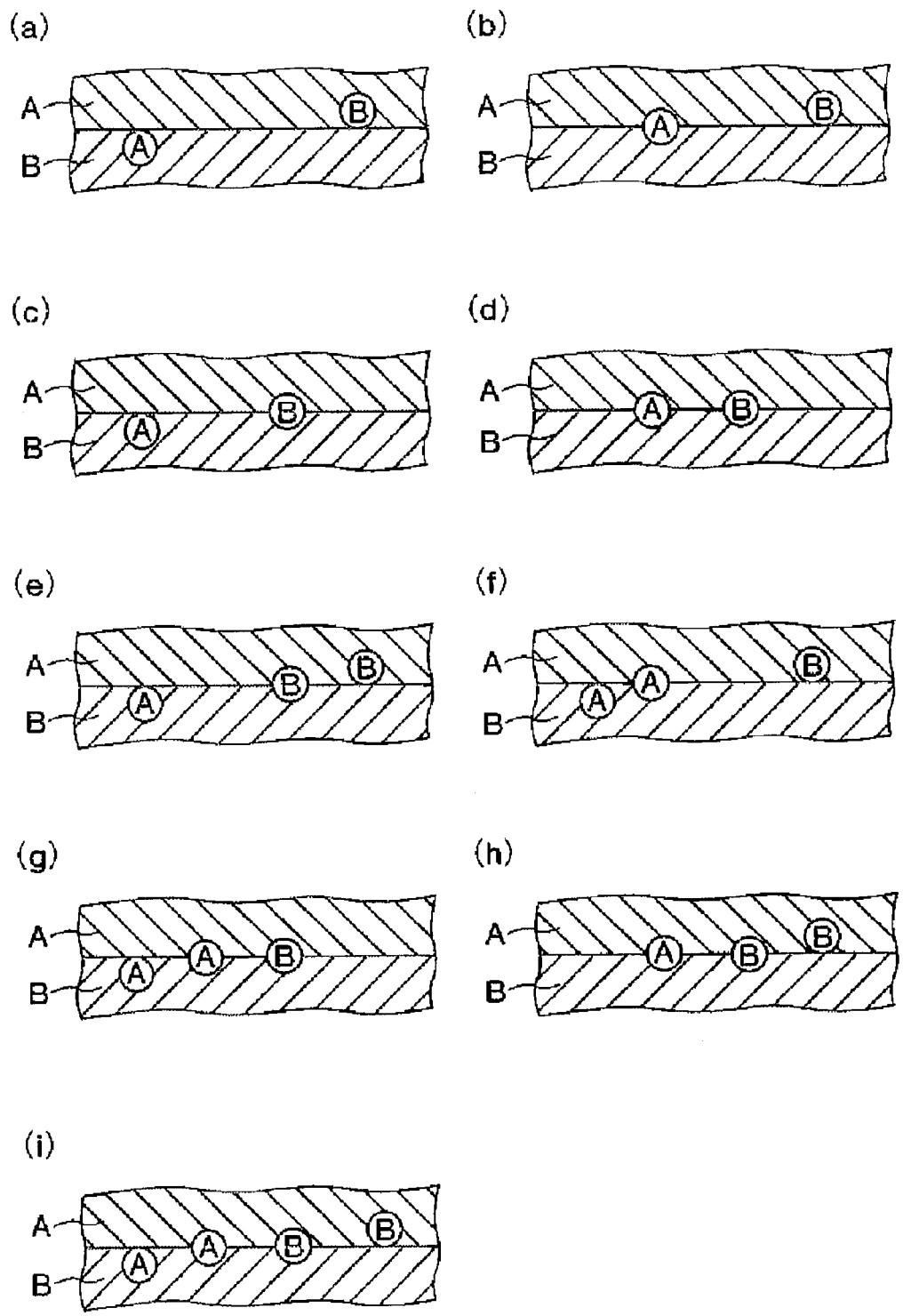
FIG. 3(a) to FIG. 3(i) are respectively schematic views (enlarged cross-sectional views) which show other arrangements of particles in the vicinity of the boundary between the hole transport layer and the light emitting layer of the organic EL device.

FIG. 1 is a cross-sectional view of an organic EL device which is one example of a light emitting device according to the present invention; FIG. 2 is an enlarged cross-sectional view of a part which is in the vicinity of the boundary between the hole transport layer and the light emitting layer of the organic EL device shown in FIG. 1; and FIG. 3(a) to FIG. 3(i) are respectively schematic views (enlarged cross-sectional views) which show other arrangements of particles in the vicinity of a boundary between a hole transport layer and a light emitting layer of the organic EL device. In the following description, the upper side in FIGS. 1 to 3 will be referred to as "upper" or "upper side" and the lower side thereof will be referred to as "lower" or "lower side".

The organic EL device 1 shown in FIG. 1 includes a transparent substrate 2, an anode 3 provided on the substrate 2, an organic EL layer 4 (including a hole transport layer 41 and a light emitting layer 42) provided on the anode 3, a cathode 5 provided on the organic EL layer 4 and a protection layer 6 provided so as to cover these layers 3, 4 and 5.

The substrate 2 serves as a support for the organic EL device 1, and the layers described above are formed on the substrate 2.

As a constituent material of the substrate 2, a material having a light-transmitting property and a good optical property can be used.

Examples of such a material include various resins such as polyethylene terephthalate, polyethylene naphthalate, polypropylene, cycloolefin polymer, polyamide, polyethersulfone, polymethylmethacrylate, polycarbonate, and polyarylate, and various glass materials, and the like. At least one of these materials can be used as a constituent material of the substrate 2.

The average thickness of the substrate 2 is not particularly limited, but is preferably in the range of about 0.1 to 30 mm, and more preferably in the range of about 0.1 to 10 mm.

The anode 3 is an electrode which injects holes into the organic EL layer 4 (that is, into a hole transport layer 41 described later). This anode 3 is made substantially transparent (which includes transparent and colorless, colored and transparent, or translucent) so that light emission from the organic EL layer 4 (that is, from a light emitting layer 42 described later) can be visually identified.

From such a viewpoint, a material having a high work function, excellent conductivity, and a light transmitting property is preferably used as the constituent material of the anode 3 (hereinafter, referred to as "anode material").

Examples of such an anode material include oxides such as ITO (Indium Tin Oxide), $SnO_2$, Sb-containing $SnO_2$, and Al-containing ZnO, Au, Pt, Ag, Cu, and alloys containing two or more of them. At least one of these materials can be used as an anode material.

The average thickness of the anode 3 is not limited to any specific value, but is preferably in the range of about 10 to 200 nm, and more preferably in the range of about 50 to 150 nm.

If the thickness of the anode 3 is too thin, there is a case that a function of the anode 3 will not be sufficiently exhibited. On the other hand, if the anode 3 is too thick, there is a case that the light transmittance will be significantly lowered depending on, for example, the kind of anode material used, thus resulting in an organic EL device that is not suitable for practical use.

It is to be noted that conductive resins such as polythiophene, polypyrrole, and the like can also be used as the anode material.

On the other hand, the cathode 5 is an electrode which injects electrons into the organic EL layer 4 (that is, into an electron transport layer 43 described later).

As a constituent material of the cathode 5 (hereinafter, referred to as "cathode material"), a material having a low work function is preferably used.

Examples of such a cathode material include Li, Mg, Ca, Sr, La, Ce, Er, Eu, Sc, Y, Yb, Ag, Cu, Al, Cs, Rb, and alloys-containing two or more of them. At least one of these materials can be used as a cathode material.

Particularly, in the case where an alloy is used as a cathode material, an alloy containing a stable metallic element such as Ag, Al, or Cu, specifically an alloy such as MgAg, AlLi, or CuLi is preferably used. The use of such an alloy as the cathode material makes it possible to improve the electron injection efficiency and stability of the cathode 5.

The average thickness of the cathode 5 is preferably in the range of about 1 nm to 1 μm, and more preferably in the range of about 100 to 400 nm. If the thickness of the cathode 5 is too thin, there is a case that a function of the cathode 5 will not be sufficiently exhibited. On the other hand, if the cathode 5 is too thick, there is a case that the light emitting efficiency of the organic EL device 1 will be lowered.

The organic EL layer 4 is provided between the anode 3 and the cathode 5. The organic EL layer 4 includes the hole transport layer 41, particles 411, the light emitting layer 42, and the electron transport layer 43, wherein the particles 411 are provided in contact with both the hole transport layer 41 and the light emitting layer 42 so that they are embedded in the light emitting layer 42, and wherein the hole transport layer 41, the light emitting layer 42 and the electron transport layer 43 are formed on the anode 3 in this order.

The hole transport layer 41 has a function of transporting holes, which are injected from the anode 3, to the light emitting layer 42 directly or through the particles 411.

Although various materials can be used as a constituent material of the hole transport layer 41, conjugated compounds having basic structures comprised of various low molecular hole transport materials or various high molecular hole transport materials mentioned below are preferably used. Such conjugated compounds can transport holes especially smoothly due to a characteristic derived from its unique spread of the electron cloud, and therefore such compounds can have especially excellent hole transport ability.

In this regard, it is to be noted that in the case where a low molecular hole transport material is used for the constituent material of the hole transport layer 41, a dense hole transport layer 41 can be obtained, so that hole transport efficiency of the hole transport layer 41 can be improved. On the other hand, in the case where a high molecular hole transport material is used for the constituent material of the hole transport layer 41, the hole transport layer 41 can be formed using various application methods such as an ink-jet printing method, a spin coating method, and the like, since such a high molecular hole transport material is dissolved in a solvent relatively easily. Further, in the case where a low molecular hole transport material is used in combination with a high molecular hole transport material, it is possible to obtain a synergistic effect that a dense hole transport layer 41 having excellent hole transport efficiency can be formed relatively easily using various application methods such as an ink-jet printing method, and the like.

Examples of such low molecular hole transport materials include arylcycloalkane-based compounds such as 1,1-bis(4-di-para-triaminophenyl)cyclohexane and 1,1'-bis(4-di-para-tolylaminophenyl)-4-phenyl-cyclohexane; arylamine-based compounds such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), N,N'-di(1-naphthyl)-N,N'-diphenyl-1,1'-biphenyl-4,4'-diamine (α-NPD), and TPTE; phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine(PDA); carbazole-based compounds such as carbazole, N-isopropylcarbazole, and N-phenylcarbazole; stilbene-based compounds such as stilbene, and 4-di-para-tolylaminostilbene; oxazole-based compounds such as $O_xZ$; triphenylmethane-based compounds such as triphenylmethane, and m-MTDATA; pyrazoline-based compounds such as 1-phenyl-3-(para-dimethylaminophenyl)pyrazoline; benzine (cyclohexadiene)-based compounds; triazole-based compounds such as triazole; imidazole-based compounds such as imidazole; oxadiazole-based compounds such as 1,3,4-oxadiazole, and 2,5-di(4-dimethylaminophenyl)-1,3,4-oxadiazole; anthracene-based compounds such as anthracene, and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo)fluorenone; aniline-based compounds such as polyaniline; silane-based compounds; thiophene-based compounds such as polythiophene, and poly(thiophenevinylene); pyrrole-based compounds such as poly(2,2'-thienylpyrrole), and 1,4-dithioketo-3,6-diphenyl-pyrrolo-(3,4-c)pyrrolopyrrole; fluorene-based compounds such as fluorene; porphyrin-based compounds such as porphyrin, and metal tetraphenylporphyrin; quinacridon-based compounds such as quinacridon; metallic or non-metallic phthalocyanine-based compounds such as phthalocyanine, copper phthalocyanine, tetra(t-butyl)copper phthalocyanine, and ironphthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N,N,N',N'-tetraphenylbenzidine. These materials may be employed singly or in combination of two or more of them. All of these materials have high hole transport ability.

Examples of such high molecular hole transport materials include polymers obtained by introducing polymerizable groups into a compound having hole transport ability and then polymerizing the compounds via their polymerizable groups.

Further, examples of such compounds include, besides the compounds obtained by introducing polymerizable groups into low molecular hole transport materials as described above, compounds represented by the following general formula (A1) or general formula (A2) having hole transport ability (which will be described later in detail). Here, it should be noted that since polymers obtained from the compounds represented by the following general formula (A1) or general formula (A2) having hole transport ability can exhibit more excellent hole transport ability, they are preferably used as a hole transport material in particular.

Examples of such polymerizable groups include polymerizable groups having photo polymerization characteristic or thermal polymerization characteristic.

Further, examples of polymerizable groups having such photo polymerization characteristic include (meth)acryloyl group, vinyl group, epoxy group and the like, and examples of polymerizable groups having such thermal polymerization characteristic include epoxy group and the like.

Furthermore, as high molecular hole transport materials, it is possible to use a poly (thiopene/styrenesulfonic acid)-based compound such as poly(3,4-ethylenedioxythiophene/styrenesulfonic acid) (PEDOT/PSS) and the like. This compound also has higher hole transport ability.

Moreover, it is also preferred that the hole transport layer 41 has a volume resistance of 10 $\Omega \cdot cm$ or more, and preferably $10^2$ $\Omega \cdot cm$ or more. This makes it possible to obtain an organic EL device 1 having high luminescent efficiency.

The average thickness of the hole transport layer 41 is not limited to any specific value, but it is preferably in the range of about 10 to 200 nm, and more preferably in the range of about 50 to 100 nm. If the thickness. of the hole transport layer 41 is too thin, there is a possibility that pin holes are to be formed. On the other hand, if the thickness of the hole transport layer 41 is too thick, it may result in a reduced transmittance of the hole transport layer 41, thus leading to the case where chromaticity (hue) of emitted light is adversely changed.

Now, the feature of the light emitting device according to the present invention resides in the structure in which particles are provided in contact with both a light emitting layer and a carrier transport layer, wherein an entire of or a part of each of the particles is embedded in one of the light emitting layer and the carrier transport layer so that the particles can contain a constituent material which constitutes the other layer.

In the embodiment shown in FIG. 1 and FIG. 2, the feature thereof resides in the structure in which particles 411 which contain the constituent material constituting the hole transport layer 41 (hole transport material) are provided at the boundary of the light emitting layer 42 and the hole transport layer 41 in contact with both the layers 41 and 42 while an entire of each of the particles 411 is embedded in the light emitting layer 42.

The particles 411 contain the same hole transport material as the hole transport layer 41. Therefore, by providing the particles 411 in contact with the hole transport layer 41, the particles 411 can exhibit the same function as the hole transport layer 41. Namely, the particles 411 can have a function that transports holes injected from the hole transport layer 41 to the light emitting layer 42.

For this reason, the combination of the hole transport layer 41 and the particles 411 can be considered as a single hole transport layer of which surface facing the light emitting layer 42 is formed with irregularities by the particles 411, and therefore such a hole transport layer can be considered to have a larger surface area as compared to the case where the hole transport layer 41 has a flat surface.

When a light emitting layer 42 is formed on such a hole transport layer 41 provided with the particles 411, that is, on the surface of the hole transport layer 41 having the irregularities, the irregularities are existed at the boundary between the hole transport layer 41 and the light emitting layer 42. This makes it possible to increase a contacting area between the light emitting layer 42 and the hole transport layer 41 with the particles 411 as compared to the case where the light emitting layer 42 is made contact with the hole transport layer through their flat surfaces. That is, it is possible to increase a contacting area between the hole transport material and the light emitting material (hereinafter, simply referred to as "contacting area"). As a result, since injection efficiency of holes (carriers) from the hole transport layer 41 to the light emitting layer 42 is increased, it is possible to improve luminous efficiency (luminous brightness) of the light emitting layer 42. Further, since this structure makes it possible to obtain sufficient luminous brightness even in the case where a relatively law voltage is applied, a half-life (which is a time required until the luminous brightness decreases half) can be prolonged and electrical power consumption of the organic EL device 1 can also be reduced.

In this regard, it is to be note that by providing the particles 411 between the hole transport layer 41 and the light emitting layer 42 so that the particles 411 are embedded on the side of the light emitting layer 42, it is possible to form the irregularities as described above relatively easily. Further, by adjusting the size of the particles 411, it is possible to control the size of the irregularities relatively easily.

In the foregoing, the description was made with regard to the embodiment in which the particles 411 containing the hole transport material are made contact with both the hole transport layer 41 and the light emitting layer 42 while the particles 411 are embedded on the side of the light emitting layer 42. However, the present invention is not limited to such a structure.

Namely, particles containing the light emitting material may be made contact with both the hole transport layer 41 and the light emitting layer 42 while the particles 411 are embedded on the side of the hole transport layer 41. With this structure, it is possible to obtain the same results as those of the above embodiment.

Further, particles containing either of the hole transport material or light emitting material may be provided so that the particles are embedded in both the hole transport layer 41 and the light emitting layer 42. This also makes it possible to obtain the same results as those of the above embodiment, and also makes it possible to improve adhesion of the particles with both the layers.

Furthermore, the shape of each particle is not limited to the spherical shape as shown in FIG. 1 and FIG. 2, and it may be formed into other shapes such as polyhedral shape and the like. By forming the particles to have such a spherical shape or polyhedral shape, it is possible to increase the contacting area more reliably.

In this regard, it is to be noted that in the case where particles 411 each having a shape other than the spherical shape are used, it is preferred that the average value of half of the sum of the maximum length and the minimum length of each of the particles 411 lies within the range of the average particle size of the spherical particles 411 which will be described later.

Further, from the viewpoint of increasing the contacting area, it is preferred that the particles 411 have the same shape, but the particles 411 may have two ore more of different shapes so that they can be used by combining them appropriately.

As shown in FIG. 2, the particles 411 are arranged between the hole transport layer 41 and the light emitting layer 42 at random. This makes it possible to prevent interference of light when the light emitting layer 42 emits light, and therefore it is also possible to prevent appropriately optical characteristics from being decreased (lowered).

In this regard, it is preferred that the particles 411 are arranged so that when an area of the surface of the hole transport layer 41 on which the particles 411 are provided when viewed from a top thereof is defined as A [$mm^2$] and the total area of the particles 411 when viewed from a top thereof is defined as B [mm$^2$], the value of B/A satisfies the relation of 0.2 to 0.8, and more preferably the relation 0.4 to 0.6. If the valve B/A is lower than the lower limit value, there is a case that it is not possible to increase the contacting area sufficiently depending on the combination of the particle size and the number of particles 411 which will be described later, thus resulting in the case where the luminous efficiency can not be satisfactorily improved. On the other hand, if the value B/A exceeds the above upper limit value, the spacing (gaps) among the particles 411 become narrow, a possibility that the particles 411 are made contact with each other becomes large or high. This may result in lowered adhesion between the light emitting layer 42 and the particles 411 due to the reduced contacting area therebetween. Further, such unfavorable contact of the plural particles 411 may cause aggregation of the particles 411, which produces uneven or irregular distribution patterns of the particles 411, that is, produces a motley pattern. An organic EL element 1 having such a patter is not preferable since optical characteristics of the organic EL element 1 are locally deteriorated.

In this regard, please note that the relation of the value B/A can be adjusted by appropriately setting the particle size of the particles 411 and the number of the particles 411.

Further, an average particle size of the particles 411 is preferably in the range of 10 to 200 nm, and more preferably in the range of 20 to 50 nm. This makes it possible to increase the contacting area reliably, while preventing the particles 411 from protruding out of the light emitting layer 42.

Furthermore, the number of the particles 411 contained within an area of 1 mm$^2$ of the surface of the hole transport layer 41 on which the particles 411 are provided when viewed from a top thereof is in the range of $1 \times 10^6$ to $1 \times 10^{11}$, and more preferably in the range of $1 \times 10^7$ to $1 \times 10^9$. This makes it possible to increase the contacting area reliably, while preventing the particles 411 from unevenly localized at a region of a part of the surface.

No particular limitation is imposed on the structures of the particles 411 so long as they can contain the hole transport material (organic semiconductor material) which is the same as the constituent material of the hole transport layer 41. For example, the particles 411 maybe of the type (1) at least a vicinity of the surface of each particle is mainly formed of the hole transport material constituting the hole transport layer 41, or (2) each particle is formed from a porous carrier so that the hole transport material is carried by it. According to the particles 411 having such a structure, the particles 411 can exhibit excellent hole transport ability as is the same with the hole transport layer 41.

In this regard, please note that the particles 411 having the structure (2) mentioned above can have excellent strength. Further, according to this structure, since the hole transport material is carried by the porous carriers so that the hole transport material enters pores of each carrier, the adhesion between the porous carriers and the hole transport material is enhanced and holes (carriers) can be also transported through the pores of each carrier.

Further, the particles 411 each having the above structure (2) have an advantage in that the particle size of the particles 411 can be controlled relatively easily by adjusting the size of the porous carriers.

In this regard, it is preferred that the porous carriers have a porosity as large as possible within the extent that the mechanical strength thereof is markedly lowered. Namely, the porosity should preferably lie within the range of about 20 to 75%, and more preferably within the range of about 35 to 60%. This makes it possible to fill the pores of the porous carriers with a larger amount of hole transport material.

The particles 411 may contain dense carriers besides the porous carriers. In this case, by forming a coating of the hole transport material around each of the dense carriers, it is possible to obtain particles 411 each having the above structure (1).

Various materials can be used as the constituent materials of the porous carriers and the dense carriers (hereinafter, they will be collectively referred to as "carriers" on occasion) if they do not give any affect on the hole transport ability of the hole transport material to be carried by the carriers. Namely, various materials can be used if they have such properties that do not decrease the hole transport ability, but preferably the carries are formed of a material containing an inorganic oxide as its main material. This makes it possible to obtain carries having the above properties relatively easily.

Examples of such an inorganic oxide include inorganic oxides containing at least one of the elements (atoms) such as Si, Al, Zsu, Sn, Li, Be, B, Na, Mg, K, Ca, Sc, V, Cr, Mn, Co, Ni, Ga, Rb, Sr, Y, Zr, Nb, Mo, Cd, Sb, Cs, Ba, La, Hf, Ta, W, Tl, Pb, Bi, Ce, Pr, Nd, Pm, Sm, Eu, Gd, Tb, Dy, Ho, Er, Tm, Yn, Lu, In, Ti, Cu, and Fe.

Among these substances, it is preferred that the inorganic oxide is constituted from at least one or more of $SiO_2$, $Al_2O_3$, ZnO, $SnO_2$, $CeO_2$, ITO, $TiO_2$, CuO, $Fe_2O_3$, CoO, and $Y_2O_3$, or an oxide complex such as ITO, ATO (antimony tin oxide) or IZO (indium zinc oxide), and more preferably constituted from at least one or more of $SiO_2$, $Al_2O_3$, ZnO, and $SnO_2$. By using these inorganic oxides, it is possible to obtain carriers having the above properties relatively easily.

The carriers may be composed from one kind of inorganic oxide mentioned above or two ore more kinds of inorganic oxides mentioned above.

The electron transport layer 43 is a layer having the function of transporting electrons injected from the cathode 5 into the light emitting layer 42. By providing such an electron transport layer 43 between the cathode 5 and the light emitting layer 42, it is possible to relatively easily control holes and electrons respectively injected from the anode 3 and the cathode 5 so that they are recombined in the light emitting layer 42.

Examples of a material that can be used for the electron transport layer 43 include: benzene-based compounds (starburst-based compounds) such as 1,3,5-tris[(3-phenyl-6-trifluoromethyl)quinoxaline-2-yl]benzene (TPQ1), and 1,3,5-tris[{3-(4-t-butylphenyl)-6-trisfluoromethyl}quinoxaline-2-yl]benzene (TPQ2); naphthalene-based compounds such as naphthalene; phenanthrene-based compounds such as phenanthrene; chrysene-based compounds such as chrysene; perylene-based compounds such as perylene; anthracene-based compounds such as anthracene; pyrene-based compounds such as pyrene; acridine-based compounds such as acridine; stilbene-based compounds such as stilbene; thiophene-based compounds such as BBOT; butadiene-based compounds such as butadiene; coumarin-based compounds such as coumarin; quinoline-based compounds such as quinoline; bistyryl-based compounds such as bistyryl; pyrazine-based compounds such as pyrazine and distyrylpyrazine; quinoxaline-based compounds such as quinoxaline; benzoquinone-based compounds such as benzoquinone, and 2,5-diphenyl-para-benzoquinone; naphthoquinone-based compounds such as naphthoquinone; anthraquinone-based compounds such as anthraquinone; oxadiazole-based compounds such as oxadiazole, 2-(4-biphenylyl)-5-(4-t-butylphenyl)-1,3,4-oxadiazole (PBD), BMD, BND, BDD, and BAPD; triazole-based compounds such as triazole, and 3,4, 5-triphenyl-1,2,4-triazole; oxazole-based compounds; anthrone-based compounds such as anthrone; fluorenone-based compounds such as fluorenone, and 1,3,8-trinitro-fluorenone (TNF); diphenoquinone-based compounds such as diphenoquinone, and MBDQ; stilbenequinone-based compounds such as stilbenequinone, and MBSQ; anthraquinodimethane-based compounds; thiopyran dioxide-based compounds; fluorenylidenemethane-based compounds; diphenyldicyanoethylene-based compounds; fluorene-based compounds such as fluorene; metallic or non-metallic phthalocyanine-based compounds such as phthalocyanine, copper phthalocyanine, and iron phthalocyanine; and various metal complexes such as 8-hydroxyquinoline aluminum ($Alq_3$), and complexes having benzooxazole or benzothiazole as a ligand. These compounds may be used singly or in combination of two or more of them.

In addition to the above mentioned compounds, polymers such as oxadiazole-based polymer (polyoxadiazole), triazole-based polymer (polytriazole), and the like, and polymers obtained from the compounds represented by the general formula (A1) or general formula (A2) (which will be described later in detail) and having electron transport ability can be used as a constituent material of the electron transport layer 43 (that is, the electron transport material).

An average thickness of the electron transport layers 43 is not limited to a specific value, but it is preferably in the range of about 1 to 100 nm, and more preferably in the range of 20 about to 50 nm. If the thickness of the electron transport layer 43 is too thin, there is a possibility that pin holes are to be formed and thereby short circuit occurs. On the other hand, if the thickness of the hole transport layer is too thick, there is a case that resistance value becomes high.

Here, when a current flows between the anode 3 and the cathode 5 (that is, a voltage is applied across the anode 3 and the cathode 5), holes emitted from the anode 3 are transported in the hole transport layer 41, and electrons are emitted from the cathode 5. Then, in the light emitting layer 42, excitons are produced by energy released upon the recombination, and the excitons release energy (in the form of fluorescence or phosphorescence) or emit light when returning to the ground state.

As a constituent material (light emitting material) of the light emitting layer 42, various materials can be used if, by using such materials, holes are injected into the light emitting layer 42 from the anode 3 and electrons are injected into the light emitting layer 42 from the cathode 5 when a voltage is applied across the anode 3 and the cathode 5 to thereby provide a filed in which the holes and the electrons can be recombined.

As such light emitting materials, there are various low molecular type light emitting materials and various high molecular type light emitting materials as mentioned hereinbelow, and at least one of these materials can be used.

In this regard, it is to be noted that when a low molecular type light emitting material is used, a dense light emitting layer 42 can be obtained, thus enabling to increase light emitting efficiency of the light emitting layer 42. On the other hand, when a high molecular type light emitting material is used, it is possible to form a light emitting layer 42 easily using any one of various application methods such as an ink-jet printing method and the like since such a material can be dissolved into a solvent relatively easily. Further, when the low molecular type light emitting material is used in combination with the high molecular type light emitting material, it is possible to obtain a synergistic effect of both the low molecular type light emitting material and the high molecular type light emitting material. That is to say, it is possible to obtain an effect that a dense light emitting layer 42 having high luminescent efficiency can be easily formed by using various application methods such as an ink-jet printing method and the like.

Examples of such low molecular type light emitting materials include: benzene-based compounds such as distyrylbenzene (DSB), and diaminodistyrylbenzene (DADSB); naphthalene-based compounds such as naphthalene and Nile red; phenanthrene-based compounds such as phenanthrene; chrysene-based compounds such as chrysene and 6-nitrochrysene; perylene-based compounds such as perylene and N,N'-bis(2,5-di-t-butylphenyl)-3,4,9,10-perylene-dicarboxyimide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole-based compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; metallic or non-metallic phthalocyanine-based compounds such as phthalocyanine ($H_2Pc$) and copper phthalocyanine; fluorene-based compounds such as fluorene; and various metallic complexes such as 8-hydroxyquinoline aluminum ($Alq_3$), tris(4-methyl-8-quinolinolate) aluminum(III) ($Almq_3$), (8-hydroxyquinoline) zinc ($Znq_2$), (1,10-phenanthroline)-tris-(4,4,4-trifluoro-1-(2-thienyl)-butane-1,3-dionate) europium(III) ($Eu(TTA)_3$(phen)), fac-tris(2-phenylpyridine) iridium (Ir(ppy) 3), and (2,3,7,8,12,13,17,18-octaethyl-21H,23H-porphin) platinum (II).

Examples of such high molecular type light emitting materials include polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly (para-phenylenevinylene) (CN-PPV), poly(2-dimethyloctyl-silyl-para-phenylenevinylene) (DMOS-PPV), and poly(2-methoxy-5-(2'-ethylhexoxy)-para-phenylenevinylene) (MEH-PPV); polythiophene-based compounds such as poly (3-alkylthiophene) (PAT), and poly(oxypropylene)triol (POPT); polyfluorene-based compounds such as poly(9,9-dialkylfluorene) (PDAF), α,ω-bis[N,N'-di(methylphenyl) aminophenyl]-poly[9,9-bis(2-ethylhexyl)fluorene-2,7-diyl] (PF2/6am4), poly(9,9-dioctyl-2,7-divinylenefluorenyl)-alt-co(anthracene-9,10-diyl); polyparaphenylene-based compounds such as poly(para-phenylene) (PPP), and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylylphenylsilane) (PBPS).

Further, in addition to the light emitting materials mentioned above, it is also possible to use a polymer obtained from the compounds represented by the above-mentioned general formula (A1) or general formula (A2) and having a light emitting property as the light emitting material. These compounds will be described later in details.

The average thickness of the light emitting layer 42 is not limited to any specific value, but is preferably in the range of about 10 to 150 nm, and more preferably in the range of about 50 to 100 nm. By setting the thickness of the light emitting layer to a value within the above range, recombination of holes and electrons efficiently occurs, thereby enabling the light emitting efficiency of the light emitting layer 42 to be further improved.

As described above, the protection layer 6 is provided so as to cover the layers 3, 4 and 5 constituting the organic EL device 1. This protection layer 6 has the function of hermetically sealing the layers 3, 4 and 5 constituting the organic EL device 1 to shut off oxygen and moisture. By providing such a protection layer 6, it is possible to obtain the effect of improving the reliability of the organic EL device 1 and the effect of preventing the alteration and deterioration of the organic EL device 1.

Examples of a constituent material of the protection layer 6 include Al, Au, Cr, Nb, Ta and Ti, alloys containing them, silicon oxide, various resin materials, and the like. In this regard, it is to be noted that in the case where a conductive material is used as a constituent material of the protection layer 6, it is preferred that an insulating film is provided between the protection layer 6 and each of the layers 3, 4 and 5 to prevent a short circuit therebetween, if necessary.

The organic EL device 1 can be used for a display, for example, but it can also be used for various optical purposes such as a light source and the like.

In the case where the organic EL device 1 is used for a display, the drive system thereof is not particularly limited, and either of an active matrix system or a passive matrix system may be employed.

The above-mentioned embodiment was described with regard to the case where the particles containing the hole transport material are used, that is, the case where the particles are composed from the same kind (one type) of particles, but the present invention is not limited to such a case, and two types of particles which include particles containing the hole transport material and particles containing the light emitting material may be used.

In this modification, the two types of particles may be arranged as schematically illustrated in one of the following patterns shown in FIG. 3(a) to FIG. 3(i), where the hole transport layer and the particles containing the hole transport material are indicated with the symbol A and the light emitting layer and the particles containing the light emitting material are indicated with the symbol B.

In the pattern shown in FIG. 3(a), all of the particles A are arranged so that the entire of each particle is embedded in the light emitting layer B and all of the particles B are arranged so that the entire of each particle is embedded in the hole transport layer A.

Further, in the pattern shown in FIG. 3(b), the particles A are arranged so that they are embedded in both the hole transport layer A and the light emitting layer B, and all of the particles B are arranged so that the entire of each particle is embedded in the hole transport layer A.

Further, in the pattern shown in FIG. 3(c), all of the particles A are arranged so that the entire of each particle is embedded in the light emitting layer B, and the particles B are arranged so that they are embedded in both the hole transport layer A and the light emitting layer B.

Further, in the pattern shown in FIG. 3(d), all of the particles A and particles B are arranged so that they are embedded in both the hole transport layer A and the light emitting layer B.

Further, in the patter shown in FIG. 3(e), all of the particles A are arranged so that they are embedded in the light emitting layer B, and some of the particles B are arranged so that the entire of each particle is embedded in the hole transport layer A and others of the particles B are arranged so that they are embedded in both the hole transport layer A and the light emitting layer B.

Further, in the patter shown in FIG. 3(f), some of the particles A are arranged so that the entire of each particle is embedded in the light emitting layer B and others of the particles A are arranged so that they are embedded in both the hole transport layer A and the light emitting layer B, and all of the particles B are arranged so that the entire of each particle is embedded in the hole transport layer A.

Further, in the patter shown in FIG. 3(g), some of the particles A are arranged so that the entire of each particle is embedded in the light emitting layer B and others of the particles A are arranged so that they are embedded in both the hole transport layer A and the light emitting layer B, and all of the particles B are arranged so that they are embedded in both the hole transport layer A and the light emitting layer B.

Further, in the patter shown in FIG. 3(h), all of the particles A are arranged so that they are embedded in both the hole transport layer A and the light emitting layer B, and some of the particles B are arranged so that the entire of each particle is embedded in the hole transport layer A and others of the particles B are arranged so that they are embedded in both the hole transport layer A and the light emitting layer B.

Further, in the patter shown in FIG. 3(i), some of the particles A are arranged so that they are embedded in both the hole transport layer A and the light emitting layer B and others of the particles A are arranged so that the entire of each particle is embedded in the light emitting layer B, and some of the particles B are arranged so that they are embedded in both the hole transport layer A and the light emitting layer B and others of the particles B are arranged sot that the entire of each particle is embedded in the hole transport layer A.

In this regard, it is to be noted that in FIG. 3(a) to FIG. 3(b), the particles indicated by the symbols A and B are used for explaining the arrangement patterns, and the ratio of the distribution of the particles may be determined appropriately.

Further, in the case where the particles A and/or B are embedded in both the layers, they may be unevenly arranged toward either of the hole transport layer A or the light emitting layer B.

Furthermore, in the embodiment described above, the description was made with regard to the case where the particles 411 are existed between the hole transport layer 41 and the light emitting layer 42, but the particles 411 may be existed between the electron transport layer 43 and the light emitting layer 42.

In more details, particles containing the electron transport material may be made contact with both the electron transport layer 43 and the light emitting layer 42 with being embedded in the side of the light emitting layer 42.

Further, particles containing the light emitting material may be made contact with both the electron transport layer 43 and the light emitting layer 42 with being embedded in the side of the electron transport layer 43.

Furthermore, particles containing either of the electron transport material or the light emitting material may be arranged so that they are embedded in both the electron transport layer 43 and the light emitting layer 42.

According to these modifications, it is also possible to obtain the same effects as those obtained in the case where the particles 411 are existed between the hole transport layer 41 and the light emitting layer 42, thereby enabling the luminous brightness of the organic EL device (that is, the light emitting layer) to be improved.

In this regard, please note that through the research made by the inventors of this application it has been confirmed that there is a tendency that the luminous brightness is well improved when the particles 411 are existed between the hole transport layer 41 and the light emitting layer 42 as compared to the case where the particles 411 are arranged between the light emitting layer 42 and the electron transport layer 43 though this tendency relies on the constituent materials of the respective layers 41, 42 and 43.

The organic EL device 1 as described above can be manufactured according to the following manner, for example.

[1] Step of Forming an Anode

First, a substrate 2 is prepared, and then an anode 3 is formed on the substrate 2.

The anode 3 can be formed by, for example, chemical vapor deposition (CVD) such as plasma CVD, thermal CVD, and laser CVD, vacuum deposition, sputtering, dry plating such as ion plating, wet plating such as electrolytic plating, immersion plating, and electroless plating, thermal spraying, a sol-gel method, a MOD method, bonding of a metallic foil, or the like.

[2] Step of Forming a Hole Transport Layer

Next, a hole transport layer 41 is formed on the anode 3.

[2-1]

First, a hole transport layer formation material containing a hole transport material (second organic semiconductor material of the present invention) or its precursor is supplied onto the anode 3 to form a liquid coating.

In supplying the hole transport layer formation material, various application methods such as a spin coating method, a casting method, a micro gravure coating method, a gravure coating method, a bar coating method, a roll coating method, a wire-bar coating method, a dip coating method, a spray coating method, a screen printing method, a flexographic printing method, an offset printing method, an ink-jet method, and the like can be employed. According to such an application method, it is possible to form the liquid coating onto the anode 3 relatively easily.

When preparing the hole transport layer formation material, a solvent or dispersion medium is used. Examples of such solvent and dispersion medium include: inorganic solvents such as nitric acid, sulfuric acid, ammonia, hydrogen peroxide, water, carbon disulfide, carbon tetrachloride, and ethylene carbonate; and various organic solvents such as ketone-based solvents e.g., methyl ethyl ketone (MEK), acetone, diethyl ketone, methyl isobutyl ketone (MIBK), methyl isopropyl ketone (MIPK), and cyclohexanone, alcohol-based solvents e.g., methanol, ethanol, isopropanol, ethylene glycol, diethylene glycol (DEG), and glycerol, ether-based solvents e.g., diethyl ether, diisopropyl ether, 1,2-dimethoxyethane (DME),1,4-dioxane, tetrahydrofuran (THF), tetrahydropyran (THP), anisole, diethylene glycol dimethyl ether (diglyme), and diethylene glycol ethyl ether (Carbitol), cellosolve-based solvents e.g., methyl cellosolve, ethyl cellosolve, and phenyl cellosolve, aliphatic hydrocarbon-based solvents e.g, hexane, pentane, heptane, and cyclohexane, aromatic hydrocarbon-based solvents e.g., toluene, xylene, and benzene, aromatic heterocyclic compound-based solvents e.g., pyridine, pyrazine, furan, pyrrole, thiophene, and methylpyrrolidone, amide-based solvents e.g., N,N-dimethylformamide (DMF) and N,N-dimethylacetamide (DMA), halogen compound-based solvents e.g., dichloromethane, chloroform, and 1,2-dichloroethane, ester-based solvents e.g., ethyl acetate, methyl acetate, and ethyl formate, sulfur compound-based solvents e.g., dimethyl sulfoxide (DMSO) and sulfolane, nitrile-based solvents e.g., acetonitrile, propionitrile, and acrylonitrile, organic acid-based solvents e.g., formic acid, acetic acid, trichloroacetic acid, and trifluoroacetic acid, and mixed solvents containing them.

Further, in the case where a compound having polymerizable groups described above is used as a precursor of the hole transport material, it is preferred that a polymerization initiator is added to the hole transport layer formation material. This makes it possible to promote a polymerization reaction at the polymerizable groups by subjecting the material to heat treatment or light irradiation treatment in the subsequent process [2-2].

Examples of a polymerization initiator include, but are not limited thereto, photopolymerization initiators such as radical photopolymerization initiators and cationic photopolymerization initiators, heat polymerization initiators, and anaerobic polymerization initiators.

Examples of such cationic photopolymerization initiators include onium salt-based cationic photopolymerization initiators such as aromatic sulfonium salt-based cationic photopolymerization initiators, aromatic iodonium salt-based cationic photopolymerization initiators, aromatic diazonium cationic photopolymerization initiators, pyridium sult-based cationic photopolymerization initiators, and aromatic phosphonium salt-based cationic photopolymerization initiators; and nonionic cationic photopolymerization initiators such as iron arene complex and sulfonate ester.

Further, examples of such radical photopolymerization initiators include benzophenone-based radical photopolymerization initiators, benzoin-based radical photopolymerization initiators, acetophenone-based radical photopolymerization initiators, benzylketal-based radical photopolymerization initiators, Michler's keton-based radical photopolymerization initiators, acylphosphine oxide-based radical photopolymerization initiators, ketocoumarin-based radical photopolymerization initiators, xanthene-based radical photopolymerization initiators, and thioxanthone-based radical photopolymerization initiators.

Further, in the case where a photopolymerization initiator is used as a polymerization initiator, a sensitizer suitable for the photopolymerization initiator to be used may be added to the hole transport layer formation material.

[2-2]

Next, the solvent or dispersion medium is removed from the liquid coating (hole transport layer formation material) supplied onto the anode 3. By removing the solvent or dispersion medium, a hole transport layer 41 is formed on the anode 3.

Examples of the method for removing the solvent or dispersion medium include a method for heating, a method for drying in vacuum or under reduced pressure, and a method for blowing an inactivated gas, and the like. Among these methods, the heating method is preferably used. According to this heating method, it is possible to remove the solvent or dispersion medium relatively easily and reliably.

In this regard, it is to be noted that in the case where the precursor of the hole transport material is a compound having polymerizable groups described above, there is another step after this step [2-2] in which the precursor is polymerized by polymerizing the polymerizable groups of the compounds to thereby obtain a polymer of the hole transport material.

Various methods can be used for polymerizing the polymerizable groups. Examples of such methods include a method for irradiating light, a heating method, an anaerobic treatment method, and the like.

When a method for irradiating light is used, infrared ray, visible ray, ultraviolet ray, X-ray and the like can be used as the light for polymerization, and these rays may be used alone or in combination of two or more of them. Among these rays, an ultraviolet ray is particularly preferable. Use of ultraviolet ray makes it possible to a progress polymerization reaction between the polymerizable groups easily and reliably.

The wavelength of the ultraviolet ray to be used is preferably in the range of about 100 to 420 nm, and more preferably in the range of about 150 to 400 nm.

Further, the intensity of irradiation of the ultraviolet ray is preferably in the range of about 1 to 600 mW/cm$^2$, and more preferably in the range of about 1 to 300 mW/cm$^2$.

Furthermore, the irradiating time of the ultraviolet ray is preferably in the range of about 60 to 600 seconds, and more preferably in the range of about 90 to 500 seconds.

By setting the wavelength, the intensity of irradiation, and the irradiating time to the ranges mentioned above, it is possible to control progress of the polymerization reactions of the polymerizable groups relatively easily.

[3] Step of Arranging Particles

Next, particles 411 are arranged or disposed on the hole transport layer 41.

[3-1]

First, a particle arrangement material from which particles 411 containing a hole transport material which is the same as the hole transport material used in the hole transport layer 41 is prepared.

The particle arrangement material can be obtained by a method (A) in which particles 411 containing the hole transport material are-dispersed in a dispersion medium, or a method (B) in which porous carriers are dispersed in a solution or dispersion medium containing the hole transport material or its precursor.

When the method (A) is employed, particles 411 having the structure (1) described above can be obtained by, for example, grinding a solid-state hole transport material; removing a dispersion medium from a dispersion liquid containing the hole transport material without causing aggregation of the hole transport material; spraying a solution containing the hole transport material, and then removing the solvent from the sprayed solution; or supplying a solution containing the hole transport material to dense carriers and then removing the solvent from the supplied solution. Further, particles 411 having the structure 2 described above can be obtained, for example, by dispersing porous carriers in a liquid-state material containing the hole transport material or its precursor, and then removing the dispersion medium. In this regard, it is preferred that the removal of the solvent or dispersion medium is carried out under the condition that vibration is added to the liquid or solution under reduced pressure by stirring it or applying ultrasound wave thereto. This makes it possible to allow the hole transport material or its precursor to enter into pores of the carriers reliably.

Further, when the method (B) is employed, it is preferred that the particle arrangement material is obtained by applying vibration under reduced pressure to the dispersion medium in which the porous carriers are dispersed. This also makes it possible to allow the hole transport material or its precursor to enter into pores of the carriers reliably.

In this regard, it is to be noted that in both the methods (A) and (B), the solvents and dispersion medium which are the same as those explained with reference to the above mentioned step [2-1] can be used as the solvents and dispersion medium used in preparing the particle arrangement material.

In these particle arrangement materials obtained by employing the methods (A) and (B), the particle arrangement material obtained by employing the method (b) is more preferable. Use of such particle arrangement material makes it possible to simplify the steps when obtaining the particle arrangement material. Further, as will be described later, it is possible to improve adhesion between the hole transport layer 41 and the particles 411 reliably.

[3-2]

Next, the particle arrangement material is supplied onto the hole transport layer 41 to form a liquid coating (coating film).

The supply of the particle arrangement material can be carried out using the same method as that explained above with reference to the step [2-1].

[3-3]

Next, the dispersion medium is removed from the liquid coating (particle arrangement material) which has been supplied onto the hole transport layer 41.

This makes it possible to arrange or dispose the particles 411 on the hole transport layer 41.

The removal of the dispersion medium can be carried out using the same method as that explained above with reference to the step [2-2].

In this regard, it is to be noted that in the case where the particle arrangement material obtained by the method (3), the hole transport material is carried by the porous carriers and it also adheres to the hole transport layer 41. As a result, it is possible to couple the porous carriers to the hole transport layer 41 through the hole transport material, thereby enabling the adhesion between the hole transport layer 41 and the particles 411 to be improved.

In the case where a compound having polymerizable groups is used as a precursor of the hole transport material, the precursor is polymerized to obtain a polymer of the hole transport material using the same method as that explained with reference to the above-mentioned step [2-2]. This also makes it possible to further enhance adhesion between the porous carriers (that is, the particles 411) and the hole transport material.

In this regard, it is to be noted that in the case where the hole transport layer 41 and the particles 411 are formed using a polymer of the hole transport material as their main material, it is possible to suppress or prevent swelling or dissolution of the hole transport material by the solvent or dispersion medium contained in the light emitting layer formation material when the light emitting layer formation material is supplied thereonto in the subsequent step [4]. As a result, it is possible to prevent mutual dissolution from occurring between the hole transport layer 41 and the light emitting layer 42, and further there is also an advantage in that the width of selection of the light emitting material is expanded.

In this regard, it is to be noted that the average particle diameter of the particles 411, the amount of the particles 411 dispersed in the particle arrangement material, and the relation between the value B/A and the amount of the particle arrangement material to be supplied may be determined in advance through experimentations.

Further, when the particles 411 comprised of the porous carriers are to be arranged on the hole transport layer 41, the following method may be employed besides the method described above in which the particles 411 are arranged on the hole transport layer 41 using the particle arrangement material described above.

[3'-1]

First, porous carriers are dispersed on the hole transport layer 41. Although there is no specific limitation on the method for dispersing the porous carriers, such dispersion of the porous carriers may be carried by supplying a dispersion liquid containing the porous carriers onto the hole transport layer 41, and then removing the dispersion medium therefrom. According to this method, it is possible to disperse the porous carriers onto the hole transport layer 41 relatively easily and reliably.

The dispersion medium, the method for supplying the dispersion medium and the method for removing the dispersion medium may be the same as those explained above with reference to the step [2].

[3'-2]

Next, a liquid material containing the hole transport material or its precursor is supplied to the thus obtained porous carriers so that the porous carriers are impregnated with the hole transport material or its precursor contained in the liquid material.

The solvent and dispersion medium used when the liquid material is to be prepared and the method for supplying the liquid material may be the same as those explained above with reference to the step [2].

[3'-3]

Next, the solvent or dispersion medium which has been impregnated with the porous carriers is removed from the liquid material. In this way, it is possible to arrange the particles 411 on the hole transport layer 41 in the same manner as the above-mentioned step [3-1] to the step [3-3].

By arranging the particles 411 using the above-described methods, the hole transport material is carried by the porous carriers, and it also adheres to the hole transport layer 41. As a result, the porous carriers are coupled to the hole transport layer 41 through the hole transport material, thereby enabling the adhesion between n the particles 411 and the hole transport layer 41 to be enhanced.

The removal of the dispersion medium can be carried out using the same method as that explained above with reference to the step [2].

In this regard, it is to be noted that in the case where the precursor of the hole transport material is a compound having polymerizable groups, the precursor is polymerized to obtain a polymer of the hole transport material using the same method as that explained with reference to the above mentioned step [2-2]

[4] Step of Forming a Light Emitting Layer

Next, a light emitting layer 42 is formed on the hole transport layer 41 in a state that the particles are interposed therebetween.

The light emitting layer 42 can be formed by, for example, applying onto the hole transport layer 41 on which the particles 411 have been disposed a light emitting layer material (that is, the first organic semiconductor material according to the present invention) obtained by dissolving the light emitting material as described above in a solvent or dispersing the light emitting material in a dispersion medium.

By using such a method, it is possible to reliably form the light emitting layer 42 so that the particles 411 are embedded into the surface of the light emitting layer 42 which is made contact with the hole transport layer 41.

As a solvent or dispersion medium in which the light emitting material is to be dissolved or dispersed, the same solvent or dispersion medium that is used in forming the hole transport layer 41 can be used.

Further, as a method for applying the light emitting layer material onto the hole transport layer 41, the same application method that is used in forming the hole transport layer 41 can be employed.

[5] Step of Forming an Electron Transport Layer

Next, an electron transport layer 43 is formed on the light emitting layer 42.

The electron transporting layer 43 can be formed in the same manner as the light emitting layer 42. Namely, the electron transport layer 43 can be formed using the electron transport material as described above by the method described with reference to the light emitting layer 42.

[6] Step of Forming a Cathode

Next, a cathode 5 is formed on the electron transport layer 43.

The cathode 5 can be formed by, for example, vacuum deposition, sputtering, bonding of a metallic foil, or the like.

[7] Step of Forming a Protection Layer

Next, a protection layer 6 is formed so as to cover the anode 3, the organic EL layer 4, and the cathode 5.

The protection layer 6 can be formed or provided by, for example, bonding a box-like protection cover made of the material as mentioned above by the use of various curable resins (adhesives).

As for such curable resins, all of thermosetting resins, photocurable resins, reactive curable resins, and anaerobic curable resins can be used.

The organic EL device 1 is manufactured through these steps as described above.

In the embodiment described above, an explanation was made with regard to the manufacturing method in which the organic EL device 1 is manufactured by laminating the respective layers 3, 4 and 5 on the substrate 2 successively in this order. However, the present invention is not limited to such a method, and the organic EL device 1 may be manufactured according to the following method.

Namely, the organic EL device 1 may be manufactured by the following method. First, a cathode 5, an electron transport layer 43 and a light emitting layer 42 are laminated on a substrate 2 successively in this order and then particles 411 containing a light emitting material are arranged on the thus formed light emitting layer 42. Thereafter, a hole transport layer 41 and an anode 3 are successively laminated on the particles 411, and then a protective cover 6 is provided so as to cover these layers 5, 4 (43, 42 and 41), 3.

Alternatively, the organic EL device 1 may be manufactured by the following method. First, a cathode 5 and a hole transport layer 41 are laminated on a substrate 2 successively in this order and then particles 411 are arranged on the thus formed hole transport layer 41 to thereby prepare a first laminate body. Next, a cathode 5, an electron transport layer 43, and a light emitting layer 42 are laminated on a flat-shaped protective layer 6 successively in this order to thereby prepare a second laminate body. Thereafter, the first laminate body and the second laminate body are faced to each other in a state that the hole transport layer 41 is opposed to the light emitting layer 42, and then they are made contact with each other while being heated to join them together. According to this method, the particles 411 can be arranged so that they are embedded in both the hole transport layer 41 and the light emitting layer 42 relatively easily.

Further, between the adjacent layers in the layers 3,4 and 5, any additional layer may be provided according to its purpose. For example, a hole injecting layer may be provided between the hole transport layer 41 and the anode 3, and/or an electron injecting layer may be provided between the electron transport layer 43 and the cathode 5. In such a case where the organic EL device 1 is provided with the hole injecting layer, the hole transport material described above may be used for the hole injecting layer. Furthermore, in the case where the organic EL device 1 is provided with the electron injecting layer as described above, alkali halides such as LiF can be used for the electron injecting layer besides the above-mentioned electron transport materials.

Furthermore, although in the above embodiment the light emitting layer 42 is separately provided from the electron transport layer 43, they may be formed into an electron transportable type light emitting layer which has the functions of both the electron transport layer 43 and the light emitting layer 42.

<Compound Represented by General Formula (A1) or (A2)>

Hereinbelow, a description will be made with regard to the compound represented by each of the following general formula (A1) (hereinafter, simply referred to as "compound (A1)") and the compound represented by the following general formula (A2) (hereinafter, simply referred to as "compound (A2)") which have been referred in the descriptions with reference to the hole transport material, the light emitting material and the electron transport material.

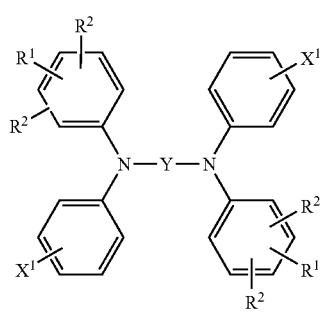

(A1)

wherein two $R^1$s are the same or different and each independently represents a straight-chain alkyl group having 2 to 8 carbon atoms, and four $R^2$s are the same or different and each independently represents a hydrogen atom, a methyl group or an ethyl group, Y represents a group containing at least one substituted or unsubstituted aromatic hydrocarbon ring or substituted or unsubstituted heterocycle, and two $X^1$s are the same kind of substituent represented by any one of the following general formulas (B1) to (B3), in which the number of carbon atoms of the two $X^1$s are the same as or different from to each other; or

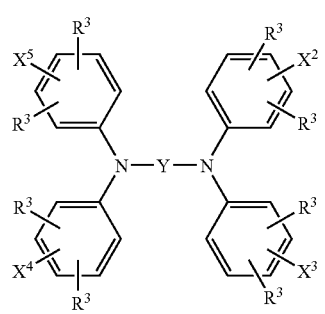

(A2)

wherein eight Rs are the same or different and each independently represents a hydrogen atom, a methyl group, or an ethyl group, Y represents a group containing at least one substituted or unsubstituted aromatic hydrocarbon ring or substituted or unsubstituted heterocycle, and $X^2$, $X^3$, $X^4$ and $X^5$ are the same kind of substituent which is represented by any one of the following general formulas (B1) to (B3), in which the number of carbon atoms of $X^2$, $X^3$, $X^4$ and $X^5$ are the same as or different from to each other.

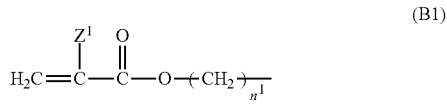

(B1)

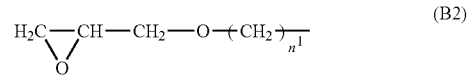

(B2)

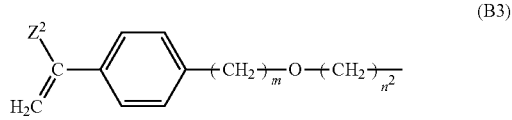

(B3)

wherein $n^1$ is an integer of 2 to 8, $n^2$ is an integer of 3 to 8, m is an integer of 0 to 3, $Z^1$ represents a hydrogen atom or a methyl group, and $Z^2$ represents a hydrogen atom, a methyl group or an ethyl group.

In this regard, it is to be noted that the term "polymerizable group" represents a substituent $X^1$ in the compound (A1), and each of the substituent $X^2$, and the substituent $X^3$ the substituent $X^4$ and the substituent $X^5$ in the compound (A2) (hereinbelow, they will be collectively referred to as the substituents $X^2$ to $X^5$ on occasions).

Although each of these compounds (A1) and (A2) can exhibit excellent carrier transport ability even in the state that the compound is not polymerized at its polymerizable groups, a polymer obtained by polymerizing each compound at its polymerizable groups $X^2$ to $X^5$ can exhibit more excellent carrier transport ability.

Accordingly, by using polymers obtained by a polymerization reaction of the compound (A1) or the compound (A2) as main constituent materials of the layers 41 to 43, each of these layers 41 to 43 can exhibit more excellent characteristics (carrier transport ability, luminous characteristic, and the like).

Hereinbelow, a description will be made with regard to the features of these polymers.

Each of the polymers is obtained by a polymerization reaction of the compound (A1) or the compound (A2) (which is a diphenylamine derivative) through its polymerizable groups, that is, a polymer in which adjacent main skeletons (diphenylamine skeleton) are linked via a chemical structure formed by the reaction between the polymerizable groups thereof (hereinafter, this chemical structure is collectively called as "link structure").

First, a description will be made with regard to a polymer obtained from the compound (A1).

In a polymer obtained by a polymerization reaction of the compounds (A1) at their substituents $X^1$ (that is, a substituent $X^1$ of a compound (A1) and a substituent $X^1$ of a compound (A1)), the polymer has a structure in which the main skeletons of the compounds are repeatedly linked via the link structure, that is, a structure in which the main skeletons repeatedly exist at a predetermined interval. Therefore, the interaction between the adjacent main skeletons decreases.

Further, each main skeleton has a conjugated chemical structure, and a unique spread of the electron cloud thereof contributes to smooth transportation of carriers (holes or electrons) in the polymer.

For this reason, the polymer exhibits high carrier transport ability. Therefore, a layer obtained by using such a polymer as its main material also has a high carrier transport ability.

In this regard, it is to be noted that if the interval between the main skeletons in the polymer is too small, interaction between the adjacent main skeletons tends to be strong. On the other hand, if the interval between the main skeletons in the polymer is too large, it becomes difficult to transfer carriers between the main skeletons, causing the carrier transport ability of the polymer to be impaired.

Therefore, it is preferred that the structure of the substituent $X^1$ is determined from these viewpoints. Specifically, in the case where a substituent represented by the above general formula (B1) or (B2) is selected as the substituent $X^1$, it is preferred that the substituent $X^1$ has a straight-chain carbon to carbon link in which $n^1$ is 2 to 8, in particular 3 to 6. Further, in the case where a substituent represented by the above general formula (B3) is selected as the substituent $X^1$, it is preferred that the substituent $X^1$ has a straight-chain carbon to carbon link in which $n^2$ is 3 to 8 and m is 0 to 3, in particular $n^2$ is 4 to 6 and m is 1 or 2.

By satisfying the above relation, it becomes possible for the adjacent main skeletons to exist at a suitable interval, thereby decreasing the interaction between the adjacent main skeletons in the polymer reliably. In addition, it is also possible to transfer carriers between the main skeletons more reliably so that the polymer can also have high carrier transport ability.

In this connection, in the case where a substituent represented by the above general formula (B1) or (B2) is selected as the substituent $X^1$, each substituent $X^1$ has a (meth)acryloyl group or an epoxy group at its end. Since each of the (meth)acryloyl group and the epoxy group has high reactivity and bonding stability, a polymerization reaction occurs through the substituents $X^1$ relatively easily to thereby form a polymer having a long chain length.

Further, the link structure obtained by a polymerization reaction of the (meth)acryloyl groups has two double bonds (n bonds) each existing between an oxygen atom and a carbon atom. Therefore, even in the case where the interval between the main skeletons becomes relatively long, transfer of carriers between the main skeletons can be carried out reliably through the two π bonds (that is, conjugated bonds).

Furthermore, since a straight-chain carbon to carbon link (i.e., an alkylene group) exists between each of the two π bonds and each main skeleton, it is possible to prevent or suppress the interaction between the main skeletons from being enhanced.

Moreover, in the link structure obtained by a polymerization reaction of the epoxy groups, an ether link (bond) and straight-chain carbon to carbon links (i.e., alkylene groups) exist. In such a link structure having the above structure, transfer of electrons is suppressed. Therefore, even in the case where the interval between the adjacent main skeletons is relatively small, it is possible to prevent or suppress the interaction between the main skeletons from being enhanced.

In this connection, it is to be noted that if the link structure has a structure having many conjugated π bonds such as a benzene ring, interaction occurs between the adjacent main skeletons through such a structure, which cancels the effect obtained by allowing the adjacent main skeletons to exist at a suitable interval.

In this regard, however, in the case where a substituent represented by the general formula (B3) is selected as the substituent $X^1$, the substituent $X^1$ has a styrene derivative group formed by introducing a substituent $Z^2$ to a styrene group as its functional group at one end thereof. Therefore, benzene rings exist in the link structure.

As a result, in the case where each of the benzene rings and each of the main skeletons having a conjugated chemical structure are too close to each other, that is, in the case where the benzene ring is linked to the main skeleton via an ether bond or in the case where the total of $n^2$ and m is two, interaction occurs between the adjacent main skeletons through the benzene rings.

However, in this polymer, the linkage between the main skeleton and the benzene ring is formed by $n^2$ and m the total of which is three or more, that is, three or more methylene groups and an ether bond exist therebetween. This makes it possible to maintain the interval between the main skeleton and the benzene ring at a suitable condition. With this result, it is possible to prevent or suppress interaction from occurring between the adjacent main skeletons appropriately.

Further, the substituent $Z^2$ is a hydrogen atom, a methyl group or an ethyl group, wherein the substituent $Z^2$ is selected in accordance with the total of $n^2$ and m, that is, the total number of methylene groups.

For example, in the case where the total number is small, a methyl group or an ethyl group is selected as the substituent $Z^2$. Since a methyl group and an ethyl group are an electron-releasing substituent, it is possible to bias electrons to the side of the main skeleton by selecting a methyl group or an ethyl group as the substituent $Z^2$. With this result, it is possible to prevent appropriately interaction from occurring between the adjacent main skeletons which are existed through the benzene rings.

Because of the reasons stated in the above, it is preferred that the two substituents $X^1$ have substantially the same number of carbon atoms, and more preferably exactly the same number of carbon atoms. In such a case, the interval between the adjacent main skeletons can be made substantially constant. Therefore, it is possible to prevent uneven distribution of the electron density from occurring in the polymer, thereby enabling carrier transport ability of the polymer to be improved.

Furthermore, it is to be noted that the substituent $X^1$ may be bonded to the 2-, 3-, 4-, 5- or 6-position of the benzene ring, but preferably bonded to the 3-, 4- or 5-position. This makes it possible to conspicuously exhibit the effect obtained by linking the adjacent main skeletons via the substituents $X^1$. Namely, it is possible for the adjacent main skeletons to exist at a suitable interval more reliably.

The substituent $R^1$ has a straight-chain alkyl group having 2 to 8 carbon atoms, preferably 3 to 6 carbon atoms. This makes it possible for adjacent polymers to exist at a suitable interval since the adjacent polymers are prevented from closely approaching to each other by steric hindrance of the substituents $R^1$. As a result, it becomes possible to reliably decrease the interaction between the adjacent main skeletons of different polymers in a layer to be formed, thereby enabling the layer to have high carrier transport ability.

Preferably, the two substituents $R^1$ contain substantially the same number of carbon atoms, more preferably the same number of carbon atoms. This makes it possible for the adjacent polymers to exist at an interval of a certain distance in the layer. As a result, the density of polymers in the layer becomes uniform.

Further, the substituent $R^1$ may be bonded to any of the 2- to 6-position of a benzene ring, but preferably it is bonded to the 4-position. This makes it possible to exhibit the effect of introduction of the substituents $R^1$ more conspicuously. Namely, it is possible to reliably prevent the adjacent polymers from closely approaching to each other.

Furthermore, as described above, the substituent $R^2$ is a hydrogen atom, a methyl group, or an ethyl group, and the substituent $R^2$ is selected in accordance with the number of carbon in the substituent $R^1$. Specifically, when the number of carbon in the substituent $R^1$ is large, a hydrogen atom is selected as the substituent $R^2$, while when the number of carbon in the substituent $R^1$ is small, a methyl group or an ethyl group is selected as the substituent $R^2$.

In the compound (A1), it is possible to change the carrier transport properties of the polymer to be formed by appropriately setting the chemical structure of a group (or a linking group) Y.

This is considered to result from the phenomenon that the energy level of the valence and conduction bands or the size of the band gap in the polymer is changed according to changes in the spread of the electron cloud (i.e., distribution of electrons) in the main skeleton which contributes to carrier transportation.

In the compound (A1), the group Y contains at least one substituted or unsubstituted aromatic hydrocarbon ring or at least one substituted or unsubstituted heterocyclic ring. By selecting the kinds of the aromatic hydrocarbon ring and/or heterocyclic ring appropriately, it is possible to adjust carrier transport properties in a resultant polymer relatively easily.

For example, by selecting a structure constituted from an unsubstituted aromatic hydrocarbon ring as the group Y, it is possible to obtain a polymer which can exhibit hole transport ability, and therefore the obtained polymer can be used as the hole transport material described above.

In more details, as for the structure constituted from the unsubstituted aromatic hydrocarbon ring, those represented by the following chemical formulas (C1) to (C17) can be mentioned.

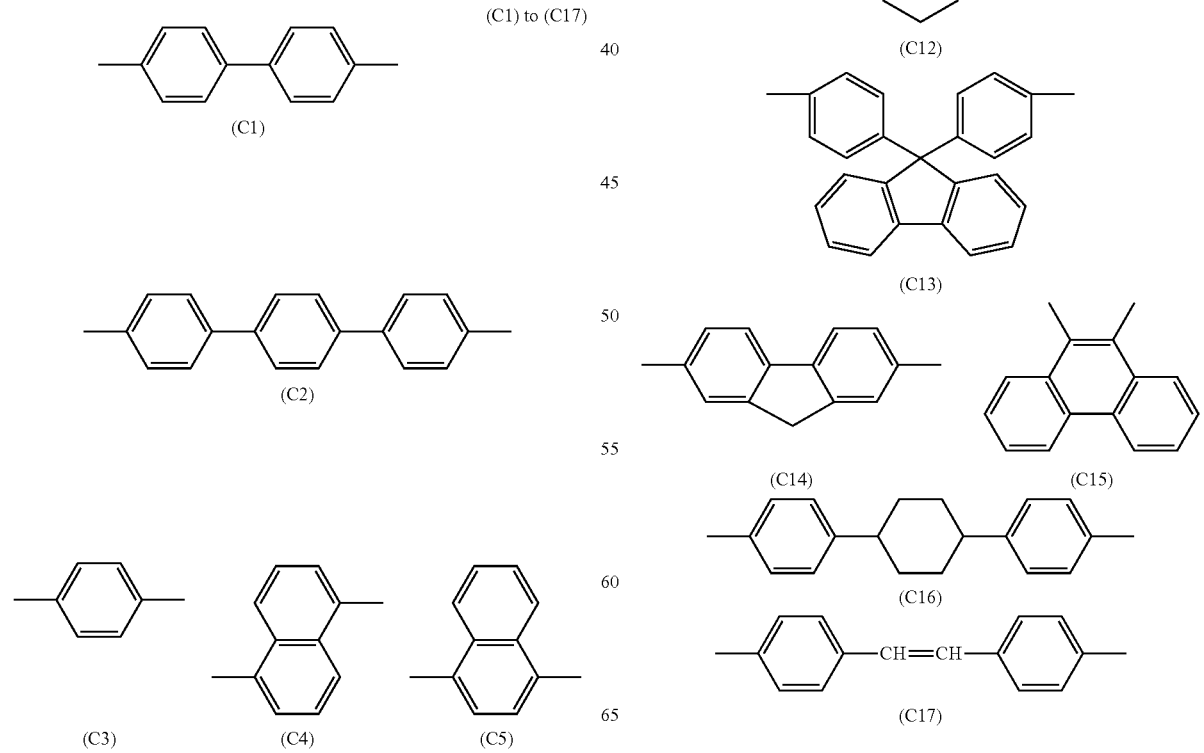

In this case, it is preferred that the group Y has 6 to 30 carbon atoms, more preferably 10 to 25 carbon atoms, and even more preferably 10 to 20, in total.

Further, in the group Y, it is preferred that the number of aromatic hydrocarbon ring is 1 to 5, more preferably 2 to 5, and even more preferably 2 or 3.

Taking the above-mentioned factors into account, in the compound (A1) a biphenylene group represented by the chemical formula (C1) or its derivative is considered to be an especially preferable structure as the group Y.

By selecting such a group, the hole transport ability in the resultant polymer becomes excellent, and thus a layer to be formed from the polymer can also have a higher hole transport ability.

Next, by selecting a structure which contains at least one substituted or unsubstituted heterocyclic ring as the group Y, it is possible to control the carrier transport property of the resultant polymer relatively easily.

As for such a heterocyclic ring, it is preferred to select a heterocyclic ring which contains at least one heteroatom selected from among nitrogen, oxygen, sulfur, selenium, and tellurium. By selecting such a heterocyclic ring that contains such a kind of heteroatom, it is particularly easy to change the energy level of the valence and conduction bands or the size of the band gap of the polymer.

The heterocyclic ring may be either an aromatic heterocycle or a nonaromatic heterocycle, but an aromatic heterocycle is preferably used. By using an aromatic heterocycle, it is possible to properly prevent the electron density of the main skeleton having a conjugated chemical structure from being biased, that is, it is possible to properly prevent the localization of n electrons. As a result, the carrier transport ability of the polymer is prevented from being lowered.

The group Y preferably contains 1 to 5 heterocyclic rings, more preferably 1 to 3 heterocyclic rings. In the case where the group Y contains 2 or more heterocyclic rings, these rings are the same or different. By allowing the group Y to have such a number of heterocyclic rings, it is possible to sufficiently change the energy level of the valence and conduction bands or the size of the band gap of the polymer.

The group Y preferably has 2 to 75 carbon atoms, more preferably 2 to 50 carbon atoms, in total. If the group Y has too many carbon atoms in total, the solubility of the compound represented by the general formula (A1) in a solvent tends to be lowered depending on the kind of substituent $X^1$.

By setting a total number of carbon atoms contained in the group Y to a value within the above range, it is possible to maintain the planarity of the main skeleton. As a result, the carrier transport ability of the polymer is reliably prevented from being impaired.

Taking these factors into account, as a structure constituted from unsubstituted heterocyclic rings, such structures as represented by any one of the following chemical formulas (D1) to (D17) are considered to be preferable structures.

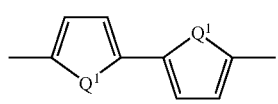
(D1)

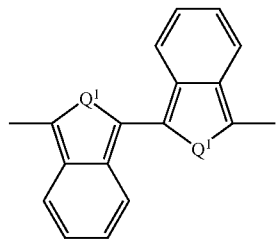
(D2)

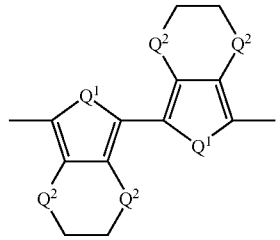
(D3)

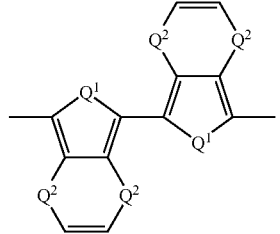
(D4)

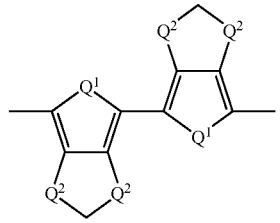
(D5)

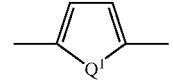
(D6)

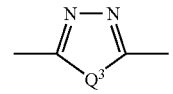
(D7)

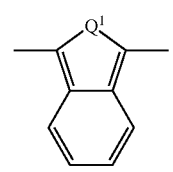
(D8)

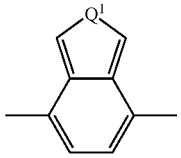
(D9)

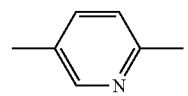
(D10)

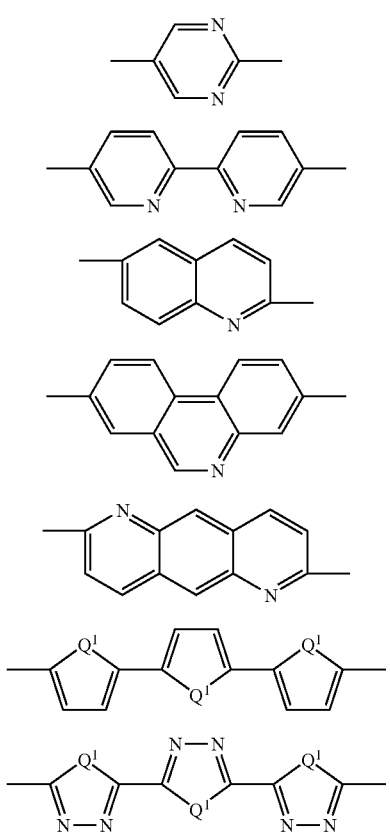

(D11)
(D12)
(D13)
(D14)
(D15)
(D16)
(D17)

wherein in these chemical formulas Q¹s are the same or different and each independently represents N-T¹, S, O, Se, or Te (where T¹ represents H, CH$_3$, or Ph), Q²s are the same or different and each independently represents S or O, and Q³s are the same or different and each independently represents N-T³, S, O, Se, or Te (where T³ represents H, CH$_3$, C$_2$H$_5$ or Ph).

Furthermore, by selecting chemical structures constituted from substituted or unsubstituted aromatic hydrocarbon ring and substituted or unsubstituted heterocyclic ring as the group (bonding group) Y, the synergistic effect resulted from the respective effects described above can be obtained.

In this regard, it is particularly preferred that such a group Y contains aromatic hydrocarbon rings respectively bonded to each of Ns in the compound (A) and a heterocyclic ring existed between the aromatic hydrocarbon rings. This makes it possible to reliably prevent electron density from being biased in a resultant polymer. As a result, carrier transport ability of the polymer can be made constant.

Taking these factors into account, as a structure constituted from the unsubstituted heterocyclic rings and the heterocyclic ring, such structures as represented by any one of the following chemical formulas (E1) to (E3) are considered to be preferable structures.

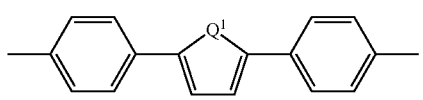

(E1)

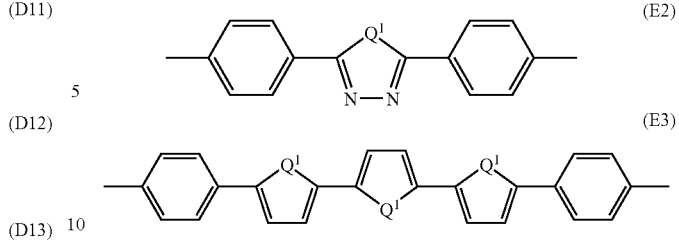

(E2)

(E3)

wherein in these chemical formulas Q¹s are the same or different and each independently represents N-T¹, S, O, Se, or Te (where T¹ represents H, CH$_3$, or Ph).

By appropriately determining the chemical structure of the group Y as described above, a polymer obtained by selecting any one of the chemical formulas (D2), (D16), (E1) and (E3) as the group Y can exhibit high hole transport ability as compared to a polymer obtained by selecting the chemical formula (D17) and can exhibit especially high hole transport ability as compared to a polymer obtained by selecting the chemical formula (D8) or (E2).

On the contrary, a polymer obtained by selecting any one of the chemical formulas (D8), (D17) and (E2) as the group Y can exhibit high electron transport ability as compared to a polymer obtained by the chemical formula (D2) or (D16). Further, a polymer obtained by selecting any one of the chemical formulas (D8), (D17) and (E2) as the group Y can also exhibit especially high electron transport ability as compared to a polymer obtained by selecting the chemical formula (D8) or (E2).

For the reasons stated in the above; in the case where a polymer obtained by selecting the structure represented by the chemical formula (D2), (D16), (E1) or (E3) as the group Y is used for the hole transport material, a polymer obtained by selecting the chemical formula (E2), (D8) and (D17) as the group Y can be used for the electron transport material.

In this regard, it is to be noted that depending on the combination of the hole transport material and the electron transport material, the polymer mentioned above can be used as the light emitting material.

For example, in the case where poly(thiophene/styrenesulfonic acid) such as poly(3,4-ethylenedioxythiophene/styrenesulfonic acid) or an arylamine compound such as N,N'-bis(1-naphthyl)-N,N'-diphenyl-benzidine(α-NPD) is used as a constituent material of the hole transport layer 412 and a triazole-based compound such as 3,4,5-triphenyl-1,2,4-triazole or an oxadiazole compound such as 2-(4-t-butylphenyl)-5-(biphenyl-4-yl)-1,3,5-oxadiazole (PBD) is used as a constituent material of the electron transport layer, a polymer of the compound represented by the general formula (A1) in which the group Y has a chemical structure represented by the chemical formula (D12) or (D14) can be used as a constituent material for forming a light emitting layer.

Further, the unsubstituted heterocyclic ring and/or the unsubstituted aromatic hydrocarbon ring contained in the group Y may introduce a substituent so long as the planarity of the main skeleton is not greatly affected. Examples of such a substituent include an alkyl group having a relatively small number of carbon atoms such as a methyl group or an ethyl group and a halogen group and the like.

Hereinbelow, a description will be made with regard to a polymer obtained from the compound (A2).

In this regard, it should be noted that the following description will be made by focusing the different points from the polymer obtained from the compound (A1), and explanations for the same or similar points are omitted.

The compound (A2) is the same as the compound (A1) excepting that the compound (A1) has two substituents $X^1$ and two substituents $R^1$ while the compound (A2) has four substituents $X^2$ to $X^5$ and eight substituents $R^3$.

As for each of the substituents X to $X^5$, a group having the same structure as that of the substituent $X^1$ is selected. In the compound (A2), since there are four substituents $X^2$ to $X^5$, a two-dimensional network is easily to be formed.

In the compound (A2), it is preferred that the substituent $X^2$ and the substituent $X^4$ are identical with each other. Namely, it is preferred that the substituent $X^2$ and the substituent $X^4$ have substantially the same number of carbon atoms and more preferably exactly the same number of carbon atoms. This makes it possible for the adjacent main skeletons of the compounds which are to be linked by the polymerization reaction between the respective substituents $X^2$ to $X^5$ (that is, the substituent $X^2$ or the substituent $X^4$) to make variation in their intervals small. Namely, it is possible to make variation in the intervals between the main skeletons small in a resultant polymer. As a result, it is possible to prevent the electron density from being biased in the resultant polymer effectively, thereby enabling hole transport ability of the polymer to be improved.

In view of the above, it is also preferred that the substituent $X^3$ and the substituent $X^5$ are identical with each other. Namely, it is also preferred that the substituent $X^3$ and the substituent $X^5$ have substantially the same number of carbon atoms and more preferably exactly the same number of carbon atoms. This makes it possible to improve the above-described effect further, thereby enabling the carrier transport ability of the polymer to be further improved.

Further, it is also preferred that the substituent $X^2$, the substituent $X^3$, the substituent $X^4$ and the substituent $X^5$ are identical with each other. Namely, it is also preferred that the substituent $X^2$, the substituent $X^3$, the substituent $X^4$ and the substituent $X^5$ have substantially the same number of carbon atoms and more preferably exactly the same number of carbon atoms. This makes it possible to exhibit the above-described effect conspicuously. Further, in this case, since the length of each of the substituents $X^2$ to $X^5$ which protrudes from the main skeleton is substantially the same (or exactly the same) with each other, it is possible to decrease a possibility that steric hindrance is caused by the substituents $X^2$ to $X^5$. Therefore, a polymerization reaction is made reliably between the substituents $X^2$ to $X^5$, that is, the polymer is produced reliably. With this result, it is possible to further improve the carrier transport ability of the polymer.

The substituent $R^3$ is a hydrogen atom, a methyl group, or a ethyl group, and the substituent $R^3$ can be selected according to the number of carbon atoms of the substituents $X^2$ to $X^5$. For example, in the case where the number of carbon atoms of the substituents $X^2$ to $X^5$ is large, a hydrogen atom is selected as the substituent $R^3$, while in the case where the number of carbon atoms of the substituent $R^3$ is small, a methyl group or an ethyl group is selected as the substituent $R^3$.

In the meantime, as the substituent $X^1$ and the substituents $X^2$ to $X^5$ (Hereinbelow, these substituents will be correctively referred to as "substituents X"), a chemical structure represented by the following general formula (B4) may be selected instead of the chemical structures represented by the general formulas (B1) to (B3). In this case, in order to obtain a polymer by a polymerization reaction at the substituents X, a polycondensation reaction can be made in a state that phosgene represented by the chemical formula $COCl_2$ and/or its derivative is mediated between the substituents X to form a chemical structure represented by the following general formula (B5):

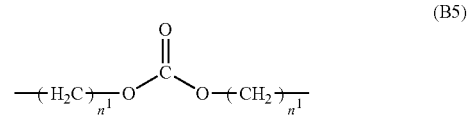

wherein each $n^1$ in these formulas independently represents an integer of 2 to 8, and these $n^1$s are the same or different.

Such a polymer has a structure in which the main skeletons are repeatedly existed through the chemical structure represented by the general formula (B5), that is, a chemical structure in which two straight-chain carbon to carbon bonds (alkylene groups) are linked through a carbonate linkage. Because of the existence of such a chemical structure, in the same manner as the case where each of the chemical structures represented by the general formulas (B1) to (B3) is used, it is possible to allow the main skeletons to exist at a predetermined interval, thereby enabling interaction between the adjacent main skeletons to be decreased.

There is no specific limitation on the kind of phosgene and/or its derivative to be used if it is possible to form the chemical structure represented by the above-mentioned general formula (B5) by a polycondensation reaction with the hydroxyl group at the end of each of the substituents X, but phosgene and/or its derivative which is mainly comprised of a compound represented by the following general formula (B6) is preferably used.

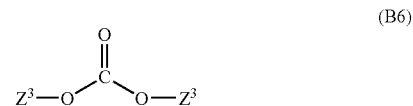

where two $Z^3$ are the sama or different, and each independently represents an alkyl group, a phenyl group, or a benzyl group each having 1 to 6 carbon atoms.

When the substituents $X^1$ are allowed to make a polycondensation reaction with phosgene and/or its derivative, a by-product material is produced. By using phosgene and/or the above-mentioned compound (B6) in the polycondensation reaction, it is possible to eliminate such a by-product material from a layer to be formed relatively easily. In this way, it is possible to prevent carriers from being captured by the by-product material in the layer to be formed. As a result, it is possible to prevent appropriately carrier transport ability of the conductive layer from being lowered.

Now, a curing agent may be added to a polymer obtained from the compound (A1) or the compound (A2) as described above. Namely, a polymerization reaction of the substituents X of the compound (A1) or the compound (A2) may be carried out via the curing agent.

Examples of such a curing agent include acryl-based curing agents, vinyl compounds such as divinylbenzene, and epoxy-based curing agents.

In this connection, in the case where the chemical structure represented by any one of the above-mentioned general formulas (B1) to (B3) is selected as the substituent X, it is particularly effective to make the polymerization reaction of the substituents X via the curing agent. This makes it possible to effectively prevent the interval between the main skeletons from becoming too small even in the case where a substituent having a relatively small number of carbon atoms, that is a substituent having a relatively short chain length is selected as the substituent X. As a result, since the interval between the main skeletons is maintained at a proper distance, it is possible to prevent reliably the interaction between the main skeletons from being increased.

In the case where the chemical structure represented by the above-mentioned general formula (B1) is selected as the substituent X, it is preferable to use at least one acryl-based curing agent selected from the group comprising a polyester (meth)acrylate curing agent, and epoxy(meth)acrylate curing agent, and a polyurethane(meth)acrylate curing agent and the like.

Examples of the polyester(meth)acrylate curing agent include the compounds represented by the following chemical formulas (F1) to (F3).

Examples of the epoxy(meth)acrylate curing agent include the compounds represented by the following chemical formulas (F4) to (F8).

Examples of the polyurethane (meth)acrylate curing agent include the compound represented by the following chemical formula (F9).

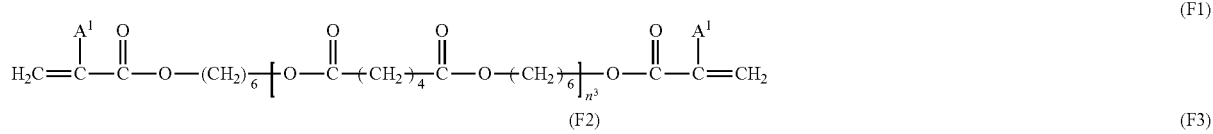
(F1)

(F2) (F3)

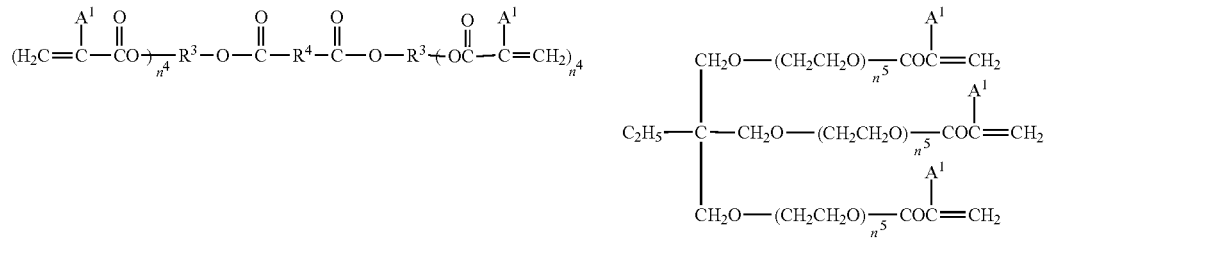
(F4)

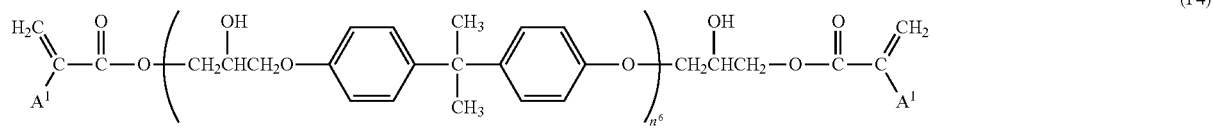
(F5)

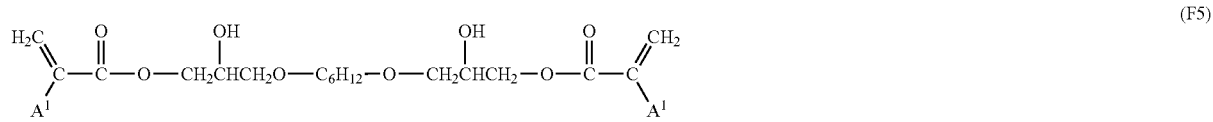
(F6)

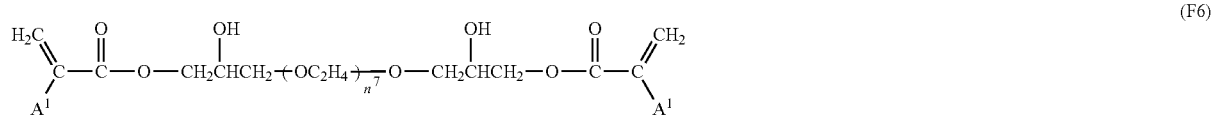
(F7) (F8)

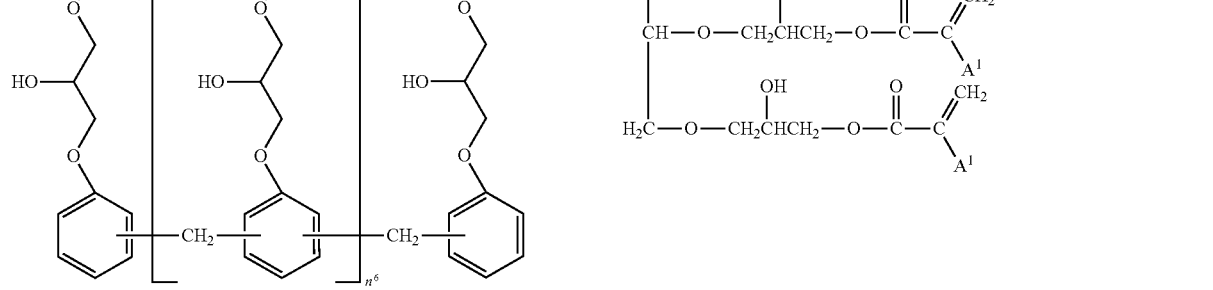

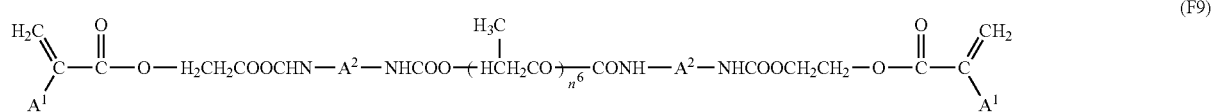
(F9)

Note that in these general formulas, $n^3$ is an integer equal to or smaller than 4,500, $n^4$ is an integer of 1 to 3, and $n^5$ is an integer of 0 to 1500. $n^6$s are the same or different, and each independently represents an integer of 1 to 10. $n^7$ is an integer of 1 to 40, and $n^8$ is an integer of 1 to 100. $R^3$s are the same or different, and each independently represents an alkylene group having carbon atoms of 1 to 10, and $R^4$ represents an alkylene group having carbon atoms of 1 to 100. $A^1$s are the same or different, and each independently represents a hydrogen atom or a methyl group. $A^2$s are the same or different, and each independently represents a group obtained by removing two isocyanate groups from a diisocyanate compound.

Further, in the case where the chemical structure represented by the general formula (B2) is selected, it is preferable to use at least one of the following epoxy-based curing agents as the curing agent. Namely, examples of such epoxy-based curing agents include a (meth)acrylic ester-based epoxy cross-linking agent, a bisphenol epoxy cross-linking agent, a glycidyl ester-based epoxy cross-linking agent, an alicyclic epoxy cross-linking agent, an urethane modified epoxy cross-linking agent, a silicon-containing epoxy cross-linking agent, a polyfunctional phenol-based epoxy cross-linking agent and a glycidyl amine-based epoxy cross-linking agent.

As for such a (meth) acrylic ester-based epoxy cross-linking agent, the compound represented by the following general formula (G1) can be mentioned.

As for such a bisphenol epoxy cross-linking agent, the compounds represented by the following general formulas (G2) to (G6) can be mentioned.

As for such a glycidyl ester-based epoxy cross-linking agent, the compounds represented by the following general formulas (G7) and (G8) can be mentioned.

As for such an alicyclic epoxy cross-linking agent, the compounds represented by the following general formulas (G9) to (G12) can be mentioned.

As for such an urethane modified epoxy cross-linking agent, a silicon-containing epoxy cross-linking agent, the compound represented by the following general formula (G13) can be mentioned.

As for such a silicon-containing epoxy cross-linking agent, the compound represented by the following general formula (G14) can be mentioned.

As for such a polyfunctional phenol-based epoxy cross-linking agent, the compounds represented by the following general formulas (G15) to (G22) can be mentioned.

As for such a glycidyl amine-based epoxy cross-linking agent, the compounds represented by the following general formulas (G23) to (G25) can be mentioned.

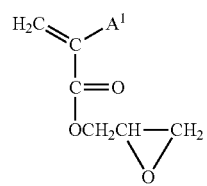

(G1)

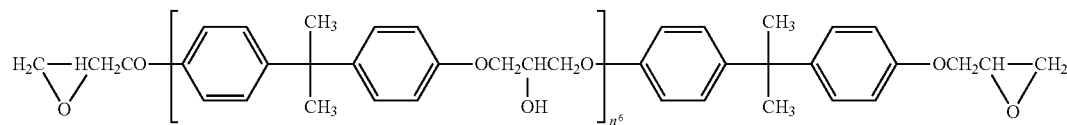

(G2)

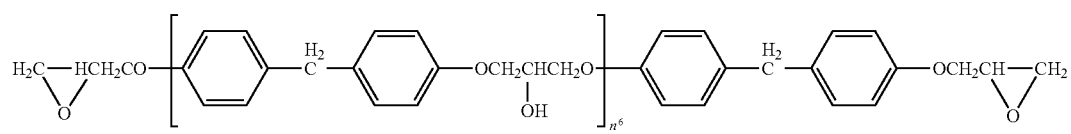

(G3)

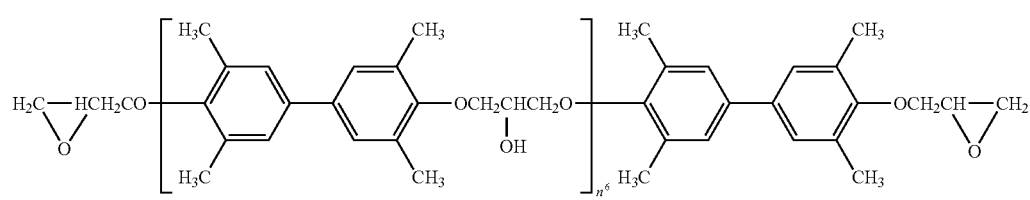

(G4)

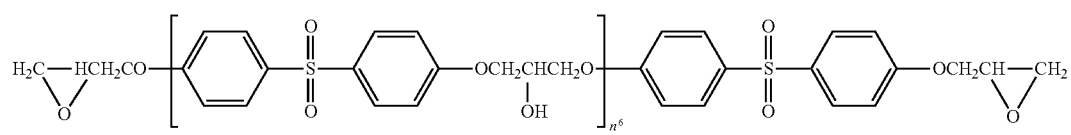

(G5)

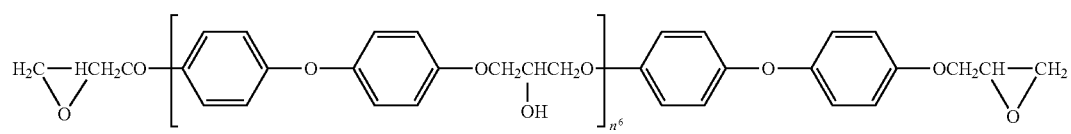

(G6)

-continued
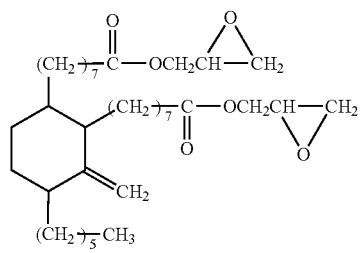 (G7)
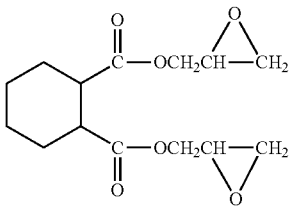 (G8)
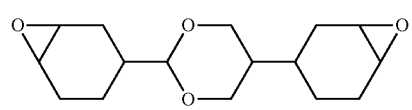 (G9)
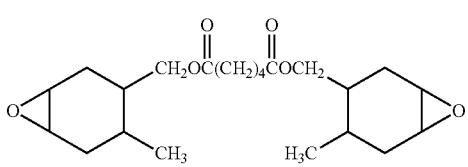 (G10)
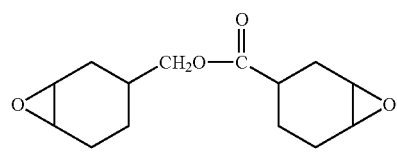 (G11)
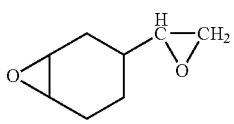 (G12)
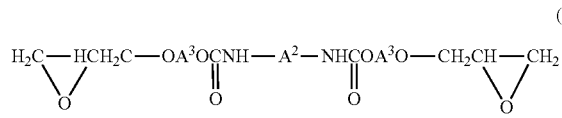 (G13)
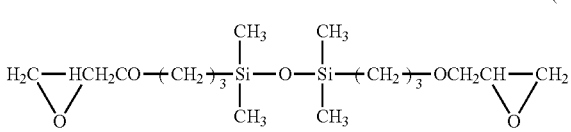 (G14)
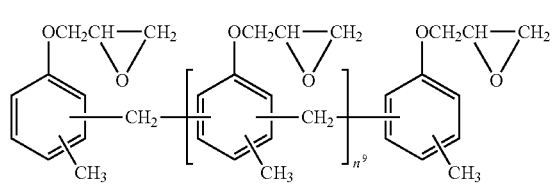 (G15)
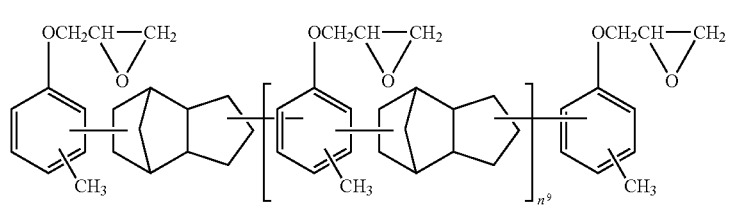 (G16)
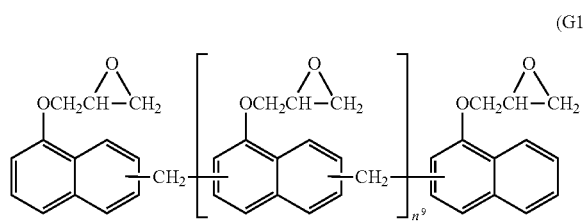 (G17)
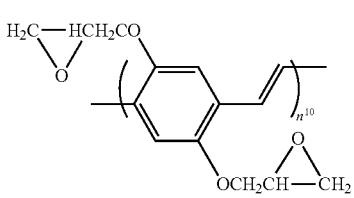 (G18)

-continued

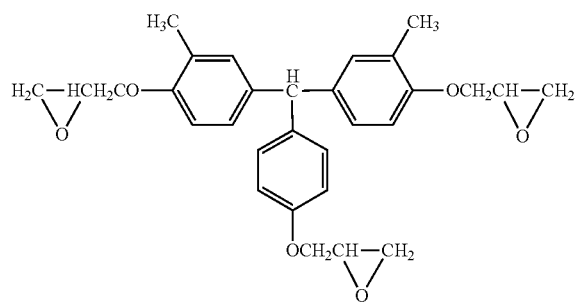
(G19)

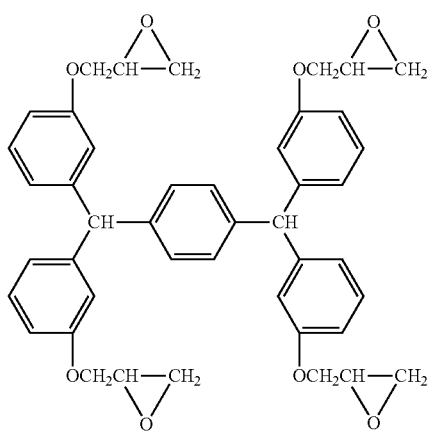
(G20)

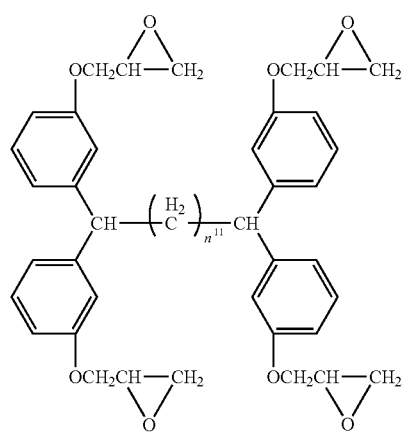
(G21)

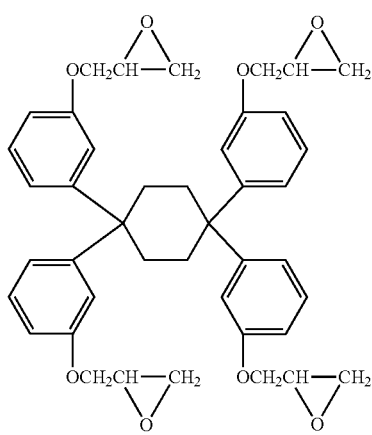
(G22)

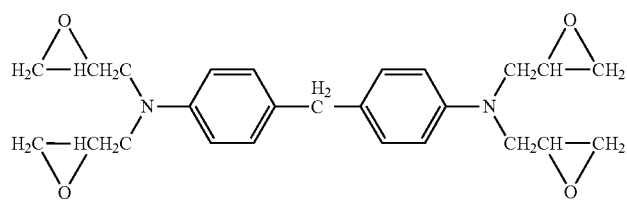
(G23)

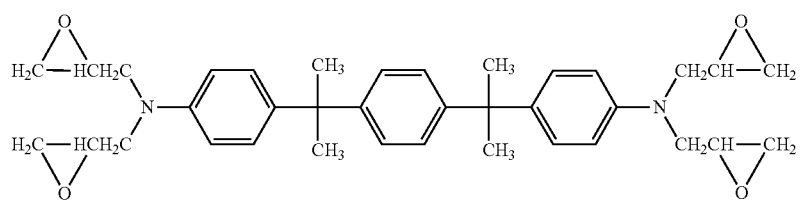
(G24)

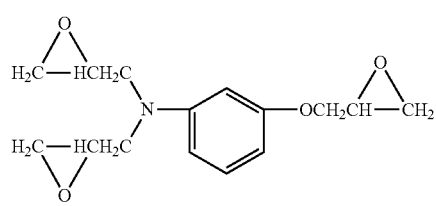
(G25)

Note that in these general formulas, $A^1$ represents a hydrogen atom or a methyl group. $n^6$s are the same or different, and each independently represents an integer of 0 to 10, and $n^9$s are the same or different, and each independently represents an integer of 1 to 20. $n^{10}$ represents an integer of 1 to 30, and $n^{11}$ is an integer of 0 to 8. $R^3$s are the same or different, and each independently represents an alkylene group having carbon atoms of 1 to 10, and $R^4$ represents an alkylene group having carbon atoms of 1 to 100. $A^2$ independently represents a group obtained by removing two isocyanate groups from a diisocyanate compound, and $A^3$s are the same or different, and each independently represents a group obtained by removing two isocyanate groups from a diisocyanate compound.

In the case where the chemical structure represented by the above-mentioned general formula (B3) is selected as the substituent X, it is preferable to use at least one vinyl compound such as polyethyleneglycol di(meth)acrylate which is represented by the hollowing general formulas (H1) and divinylbenzene.

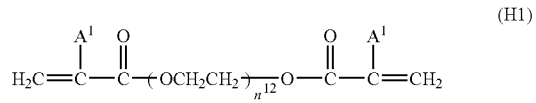

(H1)

wherein $n^{12}$ represents an integer of 5 to 15, and $A^1$s are the same or different, and each independently represents a hydrogen atom or a methyl group.

<<Electronic Equipments>>

Hereinbelow, a description will be made based on one example where the electronic device according to the present invention is applied to a display device.

Figure 4:
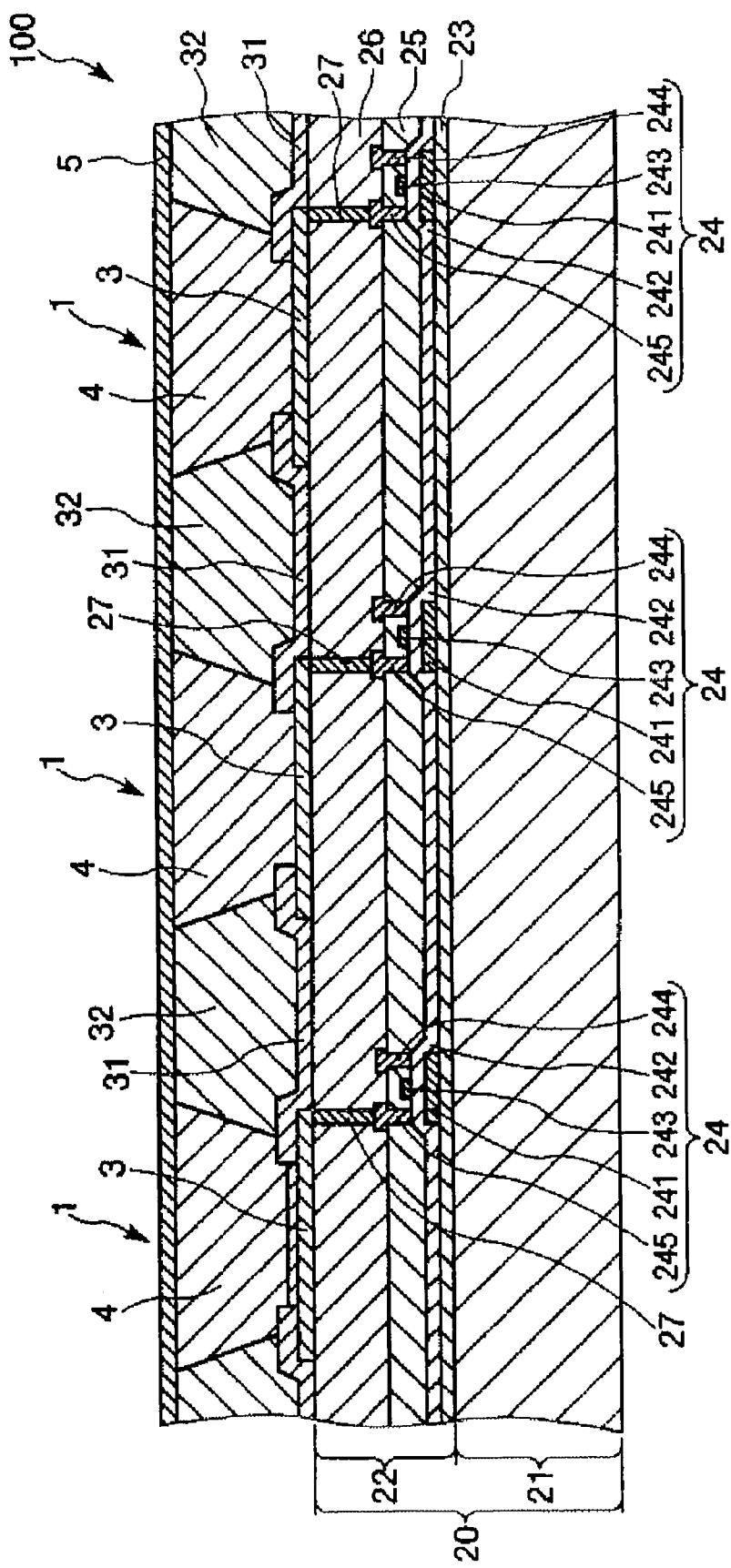
FIG. 4 is a cross-sectional view of an example of an electronic device to which the light emitting device of the present invention is applied, wherein the electronic device is a display device.

FIG. 4 is a cross-sectional view of an example of an electronic device to which the light emitting device according to the present invention is applied, wherein the electronic device is a display device.

As shown in FIG. 4, a display device 100 includes a base 20 and a plurality of organic EL elements 1 provided on the base 20.

The base 20 includes a substrate 21 and a circuit section 22 formed on the substrate 21. The circuit section 22 includes a protective layer 23 provided on the substrate 21 and formed from a titanium oxide layer, a driving TFT (switching element) 24 formed on the protective layer 23, a first insulation layer 24, and a second insulation layer 26.

The driving TFT 24 includes a semiconductor layer 241 made of a silicon, a gate insulation layer 242 formed on the semiconductor layer 241, a gate electrode 243 formed on the gate insulation layer 242, a source electrode 244, and a drain electrode 245.

The organic EL elements 1 are provided on the circuit section 22 having the above structure so as to be associated with the respective driving TFTs 24. Further, the adjacent organic EL elements 1 are partitioned by the first partitioning wall portion 31 and a second partitioning wall portion 32.

In this embodiment, an electrode of each organic EL element 1 constitutes a pixel electrode, and it is electrically connected to the drain electrode 245 of the corresponding driving TFT 24 through the wiring 27. Further, the cathode electrodes of the respective organic EL elements are formed into a common electrode. Furthermore, a seal member (not shown in the drawing) is joined to the base 20 so as to cover the respective organic EL elements 1 to thereby seal the organic EL elements 1.

The display device 100 may be formed into a single color display type, but the display device 100 can display a color image by selecting light emitting materials used for the respective organic EL elements 1.

(Electronic Equipment)

The display device 100 described above can be used for various electronic equipment.

Figure 5:
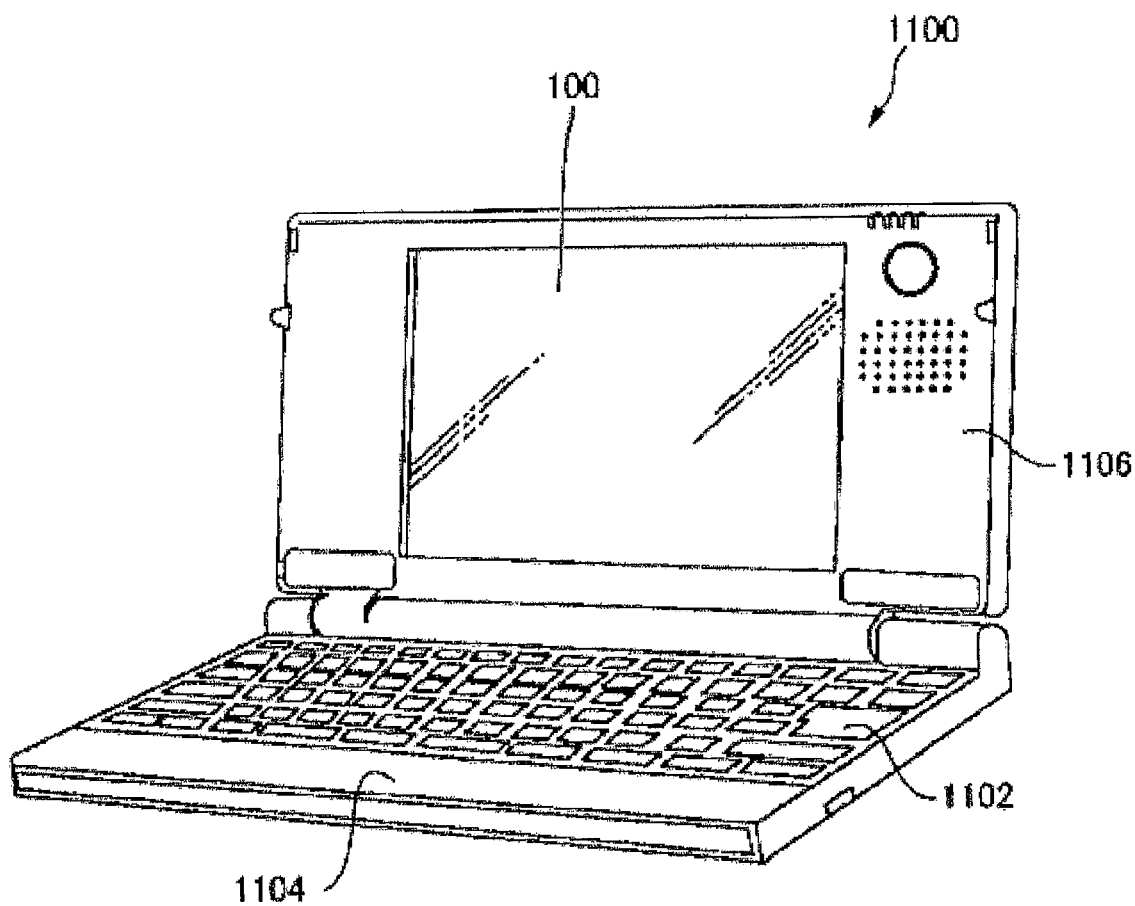
FIG. 5 is a perspective view which shows the structure of a personal mobile computer (or a personal notebook computer) which is one example of the electronic equipment according to the present invention.

FIG. 5 is a perspective view which shows the structure of a personal mobile computer (or a personal notebook computer) which is one example of the electronic equipment according to the present invention.

In FIG. 5, a personal computer 1100 is comprised of a main body 1104 provided with a keyboard 1102 and a display unit 1106 provided with a display (screen). The display unit 1106 is rotatably supported by the main body 1104 via a hinge structure.

In the personal computer 1100, the display (screen) of the display unit 1106 is constructed from the display device 100 described above.

Figure 6:
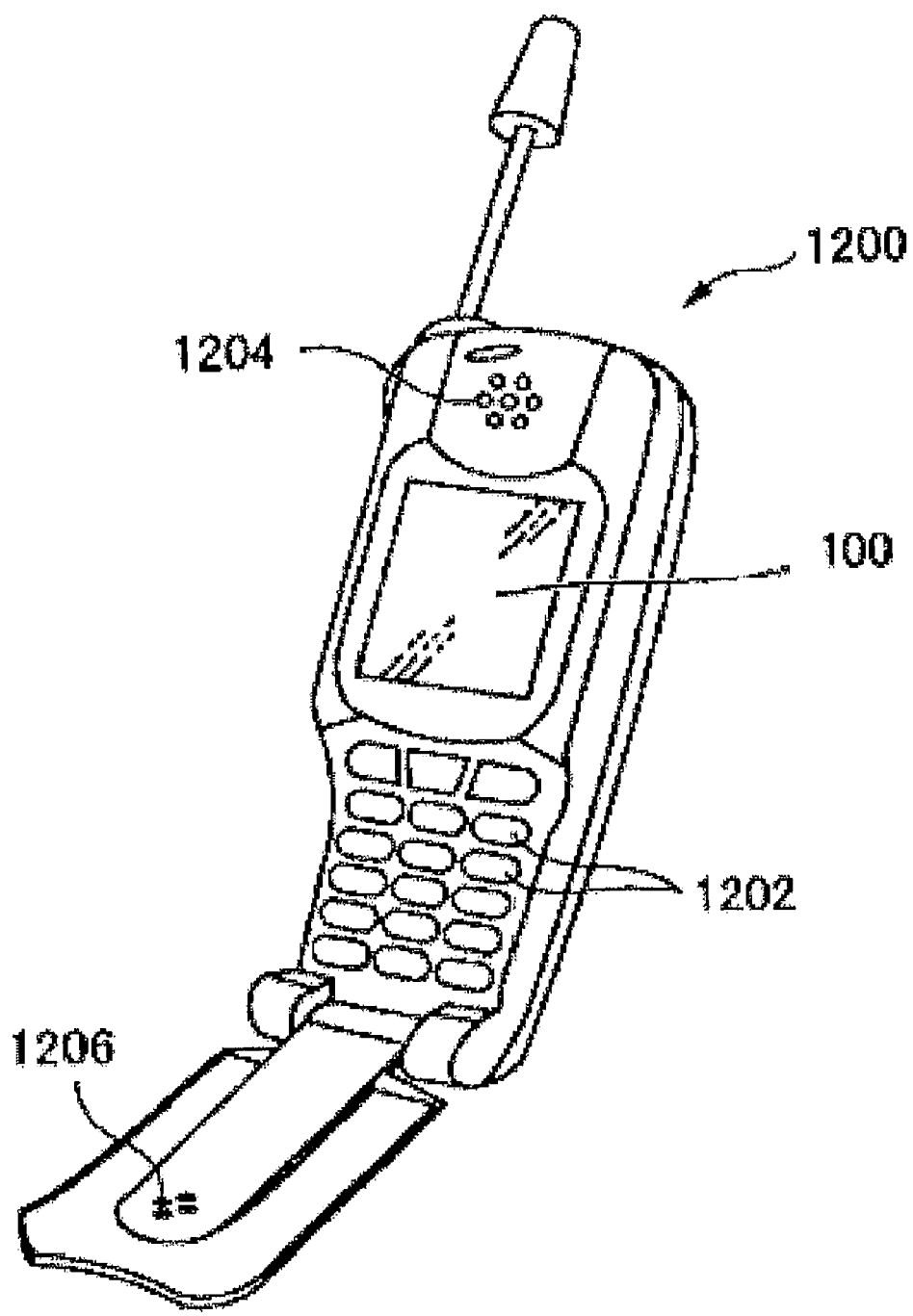
FIG. 6 is a perspective view which shows the structure of a mobile phone (including the personal handyphone system (PHS)) which is the other example of the electronic equipment according to the present invention.

FIG. 6 is a perspective view which shows the structure of a mobile phone (including the personal handyphone system (PHS)) which is the other example of the electronic equipment according to the present invention.

The mobile phone 1200 shown in FIG. 6 includes a plurality of operation buttons 1202, an earpiece 1204, a mouthpiece 1206, and a display.

In this mobile phone 1200, the display is constructed from the display device 100 as described above.

Figure 7:
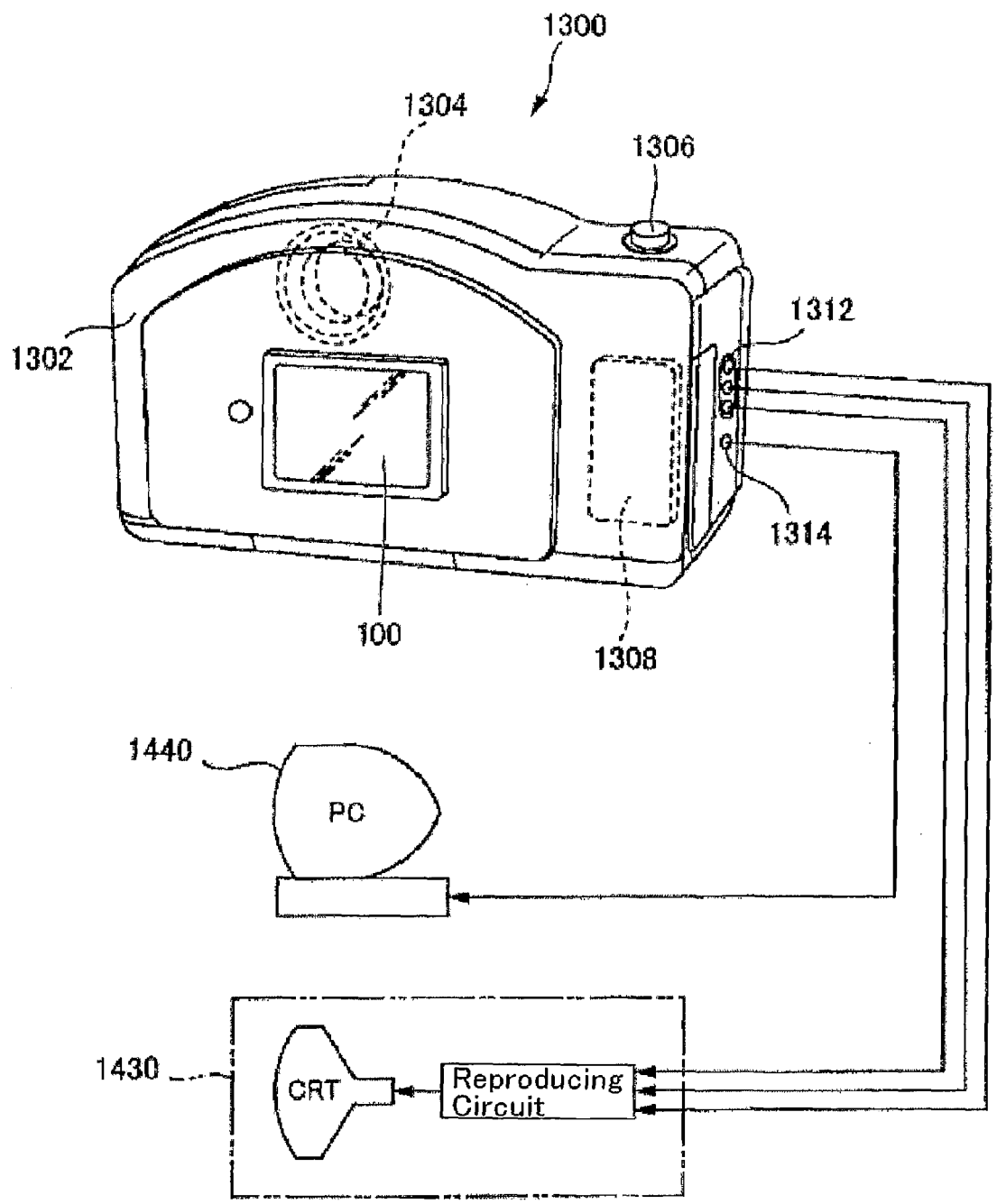
FIG. 7 is a perspective view which shows the structure of a digital still camera which is still other example of the electronic equipment according to the present invention.

FIG. 7 is a perspective view which shows the structure of a digital still camera which is still other example of the electronic equipment according to the present invention. In this drawing, interfacing to external devices is simply illustrated.

In a conventional camera, a silver salt film is exposed to the optical image of an object. On the other hand, in the digital still camera 1300, an image pickup device such as a CCD (Charge Coupled Device) generates an image pickup signal (or an image signal) by photoelectric conversion of the optical image of an object.

In the rear surface of a case (or a body) 1302 of the digital still camera 1300, there is provided a display which provides an image based on the image pickup signal generated by the CCD. That is, the display functions as a finder which displays the object as an electronic image.

In this digital still camera 1300, the display is constructed from the display device 100 as described above.

In the inside of the case, there is provided a circuit board 1308. The circuit board 1308 has a memory capable of storing an image pickup signal.

In the front surface of the case 1302 (in FIG. 7, the front surface of the case 1302 is on the back side), there is provided a light receiving unit 1304 including an optical lens (an image pickup optical system) and a CCD.

When a photographer presses a shutter button 1306 after checking an object image on the display, an image pickup signal generated by the CCD at that time is transferred to the memory in the circuit board 1308 and then stored therein.

Further, in the side surface of the case 1302 of the digital still camera 1300, there are provided a video signal output terminal 1312 and an input-output terminal for data communication 1314. As shown in FIG. 7, when necessary, a television monitor 1430 and a personal computer 1440 are connected to the video signal output terminal 1312 and the input-output terminal for data communication 1314, respectively. In this case, an image pickup signal stored in the memory of the circuit board 1308 is outputted to the television monitor 1430 or the personal computer 1440 by carrying out predetermined operations.

The electronic equipment according to the present invention can be applied not only to the personal computer (which is a personal mobile computer) shown in FIG. 5, the mobile phone shown in FIG. 6, and the digital still camera shown in FIG. 7 but also to a television set, a video camera, a view-finer or monitor type of video tape recorder, a laptop-type personal computer, a car navigation device, a pager, an electronic notepad (which may have communication facility), an electronic dictionary, an electronic calculator, a computerized game machine, a word processor, a workstation, a videophone, a security television monitor, an electronic binocular, a POS terminal, an apparatus provided with a touch panel (e.g., a cash dispenser located on a financial institute, a ticket vending machine), medical equipment (e.g., an electronic thermometer, a sphygmomanometer, a blood glucose meter, an electrocardiograph monitor, ultrasonic diagnostic equipment, an endoscope monitor), a fish detector, various measuring instruments, gages (e.g., gages for vehicles, aircraft, and boats and ships), a flight simulator, various monitors, and a projection display such as a projector.

The light emitting device and the electronic equipment according to the present invention have been described based on the embodiments shown in the drawings, but the present invention is not limited thereto.

EXAMPLES

Next, the present invention will be described with reference to the actual examples.
1. Synthesis of Compound
First, compounds (A) to (E) described below were prepared.
<Compound (A)>
1 mol of 4-hexyl aniline was dissolved in 150 mL of acetic acid, and acetic anhydride was dropped therein at room temperature and then they were stirred. After the completion of the reaction, a solid matter precipitated was filtered and then dried after washing with water to obtain a dry substance.

Next, 0.37 mol of the thus obtained substance, 0.66 mol of 1-bromo-4-hexylbenzene, 1.1 mol of potassium carbonate, copper powder, and iodine were mixed, and the mixture was heated at a temperature of 200° C. After the heated mixture was cooled down, 130 mL of isoamyl alcohol, 50 mL of pure water and 0.73 mol of potassium hydroxide were added to the mixture, and it was stirred and then dried to thereby obtain a compound.

Next, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

Then, the thus obtained compound was confirmed to be the following compound (A) by means of a mass spectrum (MS) method, a $^1$H-nuclear magnetic resonance ($^1$H-NMR) spectrum method, a $^{13}$C-nuclear magnetic resonance ($^{13}$C-NMR) spectrum method, and a Fourier transform infrared absorption (FT-IR) spectrum method.
<Compound (B)>
6-(p-aminophenyl)hexanol was treated with 4-methoxybenzylbromide and sodium hydride in anhydrous dimethylformamide to transform hydroxyl groups into benzyl ether groups and then it was protected.

Next, 1 mol of the obtained compound was dissolved in 150 mL of acetic acid, and acetic anhydride was dropped therein at room temperature and then they were stirred. After the completion of the reaction, a solid matter precipitated was filtered and then dried after washing with water.

Next, 0.37 mol of the thus obtained substance, 0.66 mol of 1-bromo-4-hexylbenzene, 1.1 mol of potassium carbonate, copper powder, and iodine were mixed and heated at a temperature of 200° C. After the mixture was cooled down, 130 mL of isoamyl alcohol, 50 mL of pure water, and 0.73 mol of potassium hydroxide were added to the mixture, and then they were stirred and dried.

Further, 130 mmol of the thus obtained compound, 62 mmol of 4,4'-diiodobiphenyl, 1.3 mmol of palladium acetate, 5.2 mmol of t-butylphosphine, 260 mmol of sodium t-butoxide, and 700 mL of xylene were mixed, and then they were stirred at a temperature of 120° C. Thereafter, the mixture was cooled for crystallization.

The thus obtained compound was then reduced by hydrogen gas using Pd—C catalyst so that transformation was made from the benzyl ether groups to the hydroxyl groups to carry out deprotection.

Next, 100 mmol of the compound and 2000 mmol of epichlorohydrin were added to 50% of sodium hydroxide solution to which a small amount of a hydrogen sulphate of tetra-n-butylammonium (phase transfer catalyst) had been added, and then they were stirred for 10 hours at room temperature. Thereafter, the mixture was cooled for crystallization to obtain a compound.

Then, the thus obtained compound was confirmed to be the following compound (B) by means of the MS method, the $^1$H-NMR method, the $^{13}$C-NMR method, and the FT-IR method.
<Compound (C)>
As the following compound (C), poly(3,4-ethylenedioxythiophene/styrenesulfonic acid) ("BAYTRON P CH800", produced by Bayer AG) was prepared.
<Compound (D)>
As the following compound (D), poly(9,9-dioctyl-2,7-divinylenefluorenyl-ortho-co(anthracene-9,10-diyl) (produced by American Dye Source, Ltd.) was prepared.
<Compound (E)>
As the following compound (E), 3,5-bis(4-tert-butyl-phenyl),4-phenyl-1,2,4-triazole ("OPA 2938", produced by TOSCO CO., LTD.) was prepared.

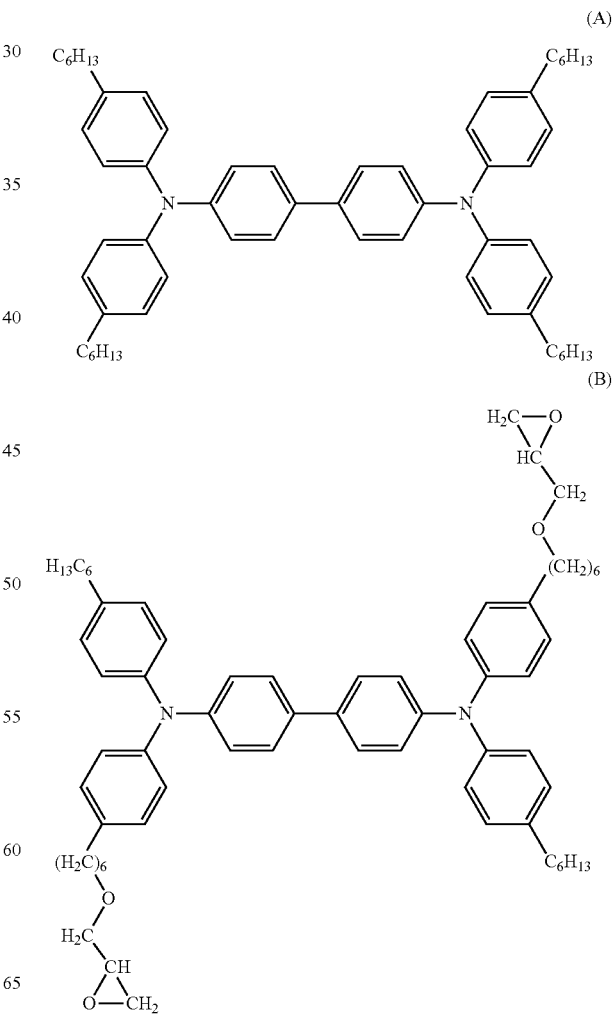

-continued

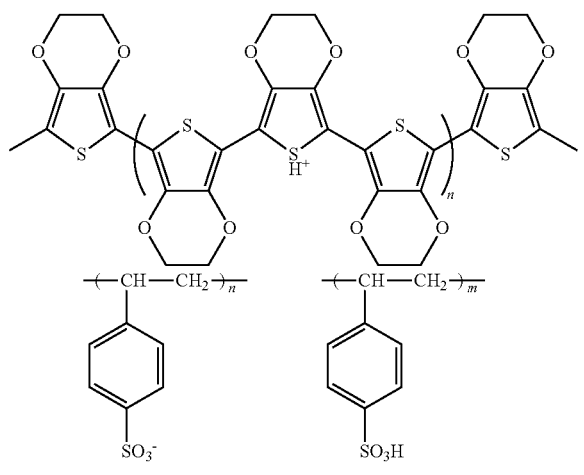

(C)

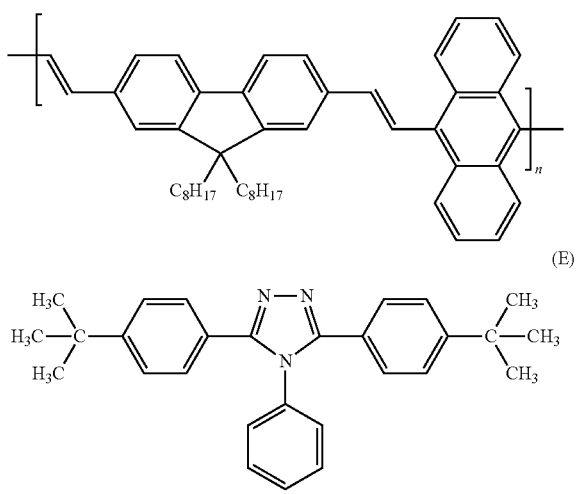

(D)

(E)

2. Manufacture of Organic EL Device

Five organic EL devices were manufactured in each of the following Examples and Comparative Examples.

Example 1A

Preparation of Particle Arrangement Material

Fine particles made of $SiO_2$ (hereinafter, referred to as $SiO_2$ fine particles) and having an average particle size of 25 nm (produced by C.I. KASEI CO., LTD) were used as carriers (porous particles) and the compound (A) was used as the hole transport material, and the $SiO_2$ fine particles and the compound (A) in a weight ratio of 9:1 were mixed in a xylene solution, and then the mixture was irradiated with ultrasound waves under reduced pressure to thereby prepare a particle arrangement material.

<Manufacture of Organic EL Device>

1A First, an ITO electrode (that is, an anode) was formed on a transparent glass substrate having an average thickness of 0.5 mm by vacuum evaporation so as to have an average thickness of 100 nm.

2A Next, the xylene solution of the compound (A) was applied onto the ITO electrode by a spin coating method, and then it was dried to form a hole transport layer having an average thickness of 50 nm.

3A Next, the particle arrangement material described above was applied onto the thus formed hole transport layer by a spin coating method, and then it was dried to arrange the particles having the average particle size of 28 on the hole transport layer.

At this stage, the area A $mm^2$ of the surface of the hole transport layer on which the particles were arranged when viewed from the top thereof and the total area B $mm^2$ of the particles when viewed from the top thereof were measured. As a result, the value B/A was 0.50.

4A Next, a xylene solution of the compound (D) was applied onto the hole transport layer by a spin coating method, and then it was dried to form a light emitting layer having an average thickness of 50 nm.

5A Next, a xylene solution of the compound (E) was applied onto the thus formed light emitting layer by a spin coating method, and then it was dried to thereby form an electron transport layer having an average thickness of 50 nm.

6A Next, an AlLi electrode (that is, a cathode) was formed on the electron transport layer by vacuum evaporation so as to have an average thickness of 300 nm.

7A Next, a protection cover made of polycarbonate was provided so as to cover these layers described above, and then it was secured and sealed with an ultraviolet curable resin to obtain an organic EL device.

Examples 2A to 5A

In each of Examples 2A to 5A, organic EL devices were manufactured after a particle arrangement material was prepared in the same manner as in the Example 1A except that the amount of the $SiO_2$ fine particles in the particle arrangement material and the supply amount of the particle arrangement material were adjusted so that the value B/A was set as shown in Table 1.

Example 6A

Preparation of Particle Arrangement Material

Fine particles made of $SiO_2$ (hereinafter, referred to as $SiO_2$ fine particles) and having an average particle size of 25 nm (produced by C.I. KASEI CO., LTD) were used as carriers (porous particles) and the compound (B) was used as a precursor of the hole transport material, and the $SiO_2$ fine particles, the compound (B) and a cationic photopolymerization initiator ("FC-508" produced by SUMITOMO BAKELITE CO., LTD) in a weight ratio of 89:10:1 were mixed in a xylene solution, and then the mixture was irradiated with ultrasound waves under reduced pressure, to thereby prepare a particle arrangement material.

<Manufacture of Organic EL Device>

1B First, an ITO electrode (that is, an anode) was formed on a transparent glass substrate in the same manner as the above-mentioned step 1A.

2B Next, a xylene solution containing the compound (B) and a cationic photopolymerization initiator ("FC-508" produced by SUMITOMO BAKELITE CO., LTD) in a weight ratio of 99:1 (that is, a hole transport material) was applied on the ITO electrode by a spin coating method, and then it was dried. Thereafter, the hole transport material was irradiated with ultraviolet rays having a wavelength of 365 nm from a mercury lamp ("UM-452", USHIO Inc.) through a filter at an intensity of irradiation of 500 $mW/cm^2$ for 15 seconds in the dry atmosphere and then it was heated at a temperature of 110° C. for 60 minutes to cure the compound (B) to thereby form a hole transport layer having an average thickness of 50 nm.

3B Next, the particle arrangement material mentioned above was applied onto the thus formed hole transport layer by a spin coating method, and then it was dried. Thereafter, the particle arrangement material was irradiated with ultraviolet rays having a wavelength of 365 nm from a mercury lamp ("UM-452", USHIO Inc.) through a filter at an intensity of irradiation of 500 mW/cm$^2$ for 15 seconds in the dry atmosphere and then it was heated at a temperature of 110° C. for 60 minutes so that the compound (B) was carried by the carriers to thereby arrange the particles having an average particle size of 27 nm on the hole transport layer.

At this stage, the area A mm$^2$ of the surface of the hole transport layer on which the particles were arranged when viewed from the top thereof and the total area B mm$^2$ of the particles when viewed from the top thereof were measured. As a result, the value B/A was 0.60.

4B Next, a light emitting layer was formed on the hole transport layer in the same manner as the above-mentioned step 4A.

5B Next, an electron transport layer was formed on the light emitting layer in the same manner as the above-mentioned step 5A.

6B Next, an AlLi electrode (cathode) was formed on the electron transport layer in the same manner as the above-mentioned step 6A.

7B Next, in the same manner as the above-mentioned step 7A, a protection cover was provided so as to cover these layers described above, and was then secured and sealed to obtain an organic EL device.

Example 7A

Organic EL devices were manufactured after a particle arrangement material was prepared in the same manner as in the Example 1A except that Al$_2$O$_3$ fine particles having an average particle size of 31 nm (produced by C.I. KASEI CO., LTD) were used as the porous particles.

In this example, the area A mm$^2$ of the surface of the hole transport layer on which the particles were arranged when viewed from the top thereof and the total area B mm$^2$ of the particles when viewed from the top thereof were also measured. As a result, the value B/A was 0.45.

Example 8A

Organic EL devices were manufactured after a particle arrangement material was prepared in the same manner as in the Example 6A except that Al$_2$O$_3$ fine particles (having an average particle size of 31 nm (produced by C.I. KASEI CO., LTD) were used as the porous particles.

In this example, the area A mm$^2$ of the surface of the hole transport layer on which the particles were arranged when viewed from the top thereof and the total area B mm$^2$ of the particles when viewed from the top thereof were also measured. As a result, the value B/A was 0.65.

Example 1B

Preparation of Particle Arrangement Material

Fine particles made of SiO$_2$ (hereinafter, referred to as SiO$_2$ fine particles) and having an average particle size of 25 nm (produced by C.I. KASEI CO., LTD) were used as carriers (porous particles) and the compound (D) was used as a light emitting material, and the SiO$_2$ fine particles and the compound (B) in a weight ratio of 9:1 were mixed in a xylene solution, and then the mixture was irradiated with ultrasound waves under reduced pressure, to thereby prepare a particle arrangement material.

<Manufacture of Organic EL Device>

1C First, an ITO electrode (that is, an anode) was formed on a transparent glass substrate in the same manner as the above-mentioned step 1A.

2C Next, a hole transport layer was formed on the transparent glass substrate in the same manner as the above-mentioned step 2A.

3C Next, a light emitting layer was formed on the hole transport layer in the same manner as the above-mentioned step 4A.

4C Next, the particle arrangement material mentioned above was applied onto the thus formed light emitting layer by a spin coating method, and then it was dried to thereby arrange the particles having an average particle size of 28 nm.

At this stage, the area A mm$^2$ of the surface of the light emitting layer on which the particles were arranged when viewed from the top thereof and the total area B mm$^2$ of the particles when viewed from the top thereof were measured. As a result, the value B/A was 0.60.

5C Next, an electron transport layer was formed on the light emitting layer in the same manner as the above-mentioned step 5A.

6C Next, an AlLi electrode (cathode) was formed on the electron transport layer in the same manner as the above-mentioned step 6A.

7C Next, in the same manner as the above-mentioned step 7A, a protection cover was provided so as to cover these layers described above, and was then secured and sealed to obtain an organic EL device.

Example 2B

Organic EL devices were manufactured after a particle arrangement material was prepared in the same manner as in the Example 1B except that Al$_2$O$_3$ fine particles (having an average particle size of 31 nm (produced by C.I. KASEI CO., LTD) were used as the porous particles.

In this example, the area A mm$^2$ of the surface of the light emitting layer on which the particles were arranged when viewed from the top thereof and the total area B mm$^2$ of the particles when viewed from the top thereof were also measured. As a result, the value B/A was 0.50.

Example 1C

Preparation of Particle Arrangement Material

The compound (C) in a solid state was ground so as to have an average particle size of 25 nm, and then the particles of the compound (C) were dispersed in a pure water to thereby prepare a particle arrangement material.

In the compound (c), the weight ratio of 3,4-ethylenedioxythiophene and styrenesulfonic acid was 1:20.

<Manufacture of Organic EL Device>

Organic EL devices were manufactured after a particle arrangement material was prepared in the same manner as in the Example 1A except that a water dispersion liquid of the compound (C) was used for forming the hole transport layer in the above-mentioned step 2A, and that this particle arrangement material was used for the arrangement of the particles in the above-mentioned step 3A.

In this example, the area A mm² of the surface of the hole transport layer on which the particles were arranged when viewed from the top thereof and the total area B mm² of the particles when viewed from the top thereof were also measured. As a result, the value B/A was 0.40.

Example 1D

Preparation of Carrier Dispersion Material

A carrier dispersion material was prepared by mixing fine particles made of $SiO_2$ and having an average particle size of 25 nm (produced by C.I. KASEI CO., LTD) with a xylene solution.

<Manufacture of Organic EL Device>

1D First, an ITO electrode (that is, an anode) was formed on a transparent glass substrate in the same manner as the above-mentioned step 1A.

2D Next, a hole transport layer was formed on the transparent glass substrate in the same manner as the above-mentioned step 2A.

3D Next, the carrier dispersion material was applied onto the hole transport layer by a spin coating method so that the particles are dispersed, and then it was dried.

4D Next, a xylene solution of the compound (A) was applied on the hole transport layer by a spin coating method so that the carriers were impregnated with the solution, and then it was dried to thereby arrange the particles having an average particle size of 27 nm.

At this stage, the area A mm² of the surface of the hole transport layer on which the particles were arranged when viewed from the top thereof and the total area B mm² of the particles when viewed from the top thereof were measured. As a result, the value B/A was 0.55.

5D Next, a light emitting layer was formed on the hole transport layer in the same manner as the above-mentioned step 4A.

6D Next, an electron transport layer was formed on the light emitting layer in the same manner as the above-mentioned step 5A.

7D Next, an AlLi electrode (cathode) was formed on the electron transport layer in the same manner as the above-mentioned step 6A.

8D Next, in the same manner as the above-mentioned step 7A, a protection cover was provided so as to cover these layers described above, and was then secured and sealed to obtain an organic EL device.

Example 2D

Organic EL devices were manufactured after a particle arrangement material was prepared in the same manner as in the Example 1D except that $Al_2O_3$ fine particles (having an average particle size of 31 nm (produced by C.I. KASEI CO., LTD) were used as the porous particles.

In this example, the area A mm² of the surface of the hole transport layer on which the particles were arranged when viewed from the top thereof and the total area B mm² of the particles when viewed from the top thereof were also measured. As a result, the value B/A was 0.50.

Comparative Example 1A

Organic EL devices were manufactured in the same manner as in the Example 1A except that the particles were omitted.

Comparative Example 6A

Organic EL devices were manufactured in the same manner as in the Example 6A except that the particles were omitted.

Comparative Example 1C

Organic EL devices were manufactured in the same manner as in the Example 1C except that the particles were omitted.

3. Evaluation

The luminous brightness (cd/m²), the maximum luminous efficiency (1 m/W), and the time that elapsed before the luminous brightness became half of the initial value (that is, a half-life) of each of the EL devices obtained in the Examples and the Comparative Examples mentioned above were measured.

In this regard, it is to be noted that the luminous brightness was measured by applying a voltage of 6V across the ITO electrode and the AlLi electrode.

The measurement values (that is, the luminous brightness, the maximum luminous efficiency, and the half-life) of each of the Examples and the Comparative Examples were evaluated according to the following four criteria, respectively, based on the measurement values of the Comparative Example 1A as a reference.

A: The measurement value was 1.5 times or more that of the Comparative Example 3.

B: The measurement value was 1.25 times or more but less than 1.5 times that of the Comparative Example 3.

C: The measurement value was 1.00 times or more but less than 1.25 times that of the Comparative Example 3.

D: The measurement value was 0.75 times or more but less than 1.00 times that of the Comparative Example 3.

The evaluation results are shown in the attached Table 1.

TABLE 1

| | Particles | | | | | | |
|---|---|---|---|---|---|---|---|
| | Carrier/ Organic semiconductor material contained in the particles | Layer into which the particles are embedded | Layer which is in contact with the layer into which the particles are embedded | B/A | Luminous Brightness | Maximum Luminous Efficiency | Half-life |
| Ex. 1A | $SiO_2$/(A) | Light Emitting Layer | Hole Transport Layer | 0.50 | A to B | A to B | A to B |
| Ex. 2A | $SiO_2$/(A) | Light Emitting Layer | Hole Transport Layer | 0.35 | A to B | B | B |
| Ex. 3A | $SiO_2$/(A) | Light Emitting Layer | Hole Transport Layer | 0.70 | A to B | B | B |
| Ex. 4A | $SiO_2$/(A) | Light Emitting Layer | Hole Transport Layer | 0.15 | B | B | B |
| Ex. 5A | $SiO_2$/(A) | Light Emitting Layer | Hole Transport Layer | 0.90 | B | B | B |
| Ex. 6A | $SiO_2$/(B) | Light Emitting Layer | Hole Transport Layer | 0.60 | A | A | A |
| Ex. 7A | $Al_2O_3$/(A) | Light Emitting Layer | Hole Transport Layer | 0.45 | A to B | A to B | A to B |

TABLE 1-continued

| | Particles | | | | | | |
|---|---|---|---|---|---|---|---|
| | Carrier/ Organic semiconductor material contained in the particles | Layer into which the particles are embedded | Layer which is in contact with the layer into which the particles are embedded | B/A | Luminous Brightness | Maximum Luminous Efficiency | Half-life |
| Ex. 8A | $Al_2O_3$/(B) | Light Emitting Layer | Hole Transport Layer | 0.65 | A | A | A |
| Ex. 1B | $SiO_2$/(D) | Electron Transport Layer | Light Emitting Layer | 0.60 | A to B | B | A to B |
| Ex. 2B | $Al_2O_3$/(D) | Electron Transport Layer | Light Emitting Layer | 0.50 | A to B | B | A to B |
| Ex. 1C | —*1/(C) | Light Emitting Layer | Hole Transport Layer | 0.40 | A to B | B | B |
| Ex. 1D | $SiO_2$/(A) | Light Emitting Layer | Hole Transport Layer | 0.55 | A to B | A to B | A to B |
| Ex. 2D | $Al_2O_3$/(A) | Light Emitting Layer | Hole Transport Layer | 0.50 | A to B | A to B | A to B |
| Comp. Ex. 1A | | | | | —*2 | —*2 | —*2 |
| Comp. Ex. 6A | | | | | C | C | C |
| Comp. Ex. 1C | | | | | C to D | C to D | C to D |

*1No Carrier is used
*2Measurement values of the Comparative Ex. 1A are used as a reference value As shown in Table 1, all the organic EL devices of the Examples were superior to the EL devices of the Comparative Examples in their luminous brightness, maximum luminous efficiency, and half-life.

From these results, it has been confirmed that in the organic EL devices of the present invention which is provided with the particles such as those used in the respective Examples between the carrier transport layer and the light emitting layer, carrier injection efficiency is improved between these layers.

Industrial Applicability

According to the present invention, the light emitting element includes particles provided in contact with both the light emitting layer and the carrier transport layer, wherein an entire of or a part of each of the particle is embedded in one of the light emitting layer and the carrier transport layer so that the particles can contain the organic semiconductor material which constitutes the other layer. The other layer with the particles can be considered as a single layer having irregularities on its surface which is in contact with the one layer. This makes it possible to increase a contacting area between the one layer and the other layer with the particles, that is between the light emitting layer and the carrier transport layer, as compared to the case where these layers have flat surfaces through which they are made contact with each other. As a result, since an injection efficiency of holes (carriers) from the hole transport layer to the light emitting layer is increased, it is possible to improve a luminous efficiency (luminous brightness) of the light emitting layer. Further, since this structure makes it possible to obtain a sufficient luminous brightness even in the case where a relatively law voltage is applied, a half-life (which is a time required until the luminous brightness decreases half) can be prolonged and electrical power consumption of the organic EL device can also be reduced. Further, electrical equipment having such a light emitting device can have high reliability. Therefore, the present invention has industrial utilization under PCT.

The invention claimed is:

1. A light emitting device, comprising:
a light emitting layer formed of a first high molecular type organic semiconductor material;
a carrier transport layer formed of a second high molecular type organic semiconductor material and provided in contact with the light emitting layer; and
particles provided in contact with both the light emitting layer and the carrier transport layer, the particles including first particles containing the first high molecular type organic semiconductor material and embedded in both the layers and/or second particles containing the second high molecular type organic semiconductor material and embedded in both the layers.

2. The light emitting device as claimed in claim 1, wherein the average particle size of the particles is in the range of 10 to 200 nm.

3. The light emitting device as claimed in claim 1, wherein the number of the particles contained in per an area of 1 mm$^2$ of the surface of the light emitting device when viewed from a top thereof is in the range of $1\times10^6$ to $1\times10^{11}$.

4. The light emitting device as claimed in claim 1, wherein when a predetermined area of the surface of the light emitting device viewed from a top thereof is defined as A mm$^2$ and the total area of the particles contained in the predetermined area viewed from a top thereof is defined as B mm$^2$, the value of B/A satisfies the relation of 0.2 to 0.8.

5. The light emitting device as claimed in claim 1, wherein at least a surface of each of the first particles is mainly formed of the first high molecular type organic semiconductor material.

6. The light emitting device as claimed in claim 1, wherein each of the first particles is formed from a particulate porous carrier and the first high molecular type organic semiconductor material, wherein the first high molecular type organic semiconductor material is carried by the porous carriers.

7. The light emitting device as claimed in claim 6, wherein the porosity of each of the porous carriers is in the range of 20 to 75%.

8. The light emitting device as claimed in claim 6, wherein the first particles are obtained by, after the porous carriers have been provided on the light emitting layer, supplying a liquid material containing the first high molecular type organic semiconductor material or its precursor onto the porous carriers so that the porous carriers are impregnated with the liquid material.

9. The light emitting device as claimed in claim 6, wherein the porous carriers are mainly formed of inorganic oxide.

10. The light emitting device as claimed in claim 9, wherein the inorganic oxide includes at least one or more of $SiO_2$, $Al_2O_3$, ZnO, $SnO_2$, $CeO_2$, ITO, $TiO_2$, CuO, $Fe_2O_3$, CoO, and $Y_2O_3$.

11. The light emitting device as claimed in claim 1, wherein the carrier transport layer is a hole transport layer having the function of transporting holes.

12. Electrical equipment provided with the light emitting device defined in claim 1.

13. The light emitting device as claimed in claim 1, wherein at least a surface of each of the second particles is mainly formed of the second high molecular type organic semiconductor material.

14. The light emitting device as claimed in claim 1, wherein each of the second particles is formed from a particulate porous carrier and the second high molecular type organic semiconductor material, wherein the second high molecular type organic semiconductor material is carried by the porous carriers.

15. The light emitting device as claimed in claim 14, wherein the porosity of each of the porous carriers is in the range of 20 to 75%.

16. The light emitting device as claimed in claim 14, wherein the second particles are obtained by, after the porous carriers have been provided on the carrier transport layer, supplying a liquid material containing the second high molecular type organic semiconductor material or its precursor onto the porous carriers so that the porous carriers are impregnated with the liquid material.

17. The light emitting device as claimed in claim 14, wherein the porous carriers are mainly formed of inorganic oxide.

18. The light emitting device as claimed in claim 17, wherein the inorganic oxide includes at least one or more of $SiO_2$, $Al_2O_3$, ZnO, $SnO_2$, $CeO_2$, ITO, $TiO_2$, CuO, $Fe_2O_3$, CoO, and $Y_2O_3$.

19. The light emitting device as claimed in claim 1, wherein the particles further include third particles containing the first high molecular type organic semiconductor material and embedded in the carrier transport layer and/or fourth particles containing the second high molecular type organic semiconductor material and embedded in the light emitting layer.

* * * * *